United States Patent [19]
Uda et al.

[11] Patent Number: 5,955,926
[45] Date of Patent: Sep. 21, 1999

[54] POWER AMPLIFIER AND CHIP CARRIER

[75] Inventors: Hisanori Uda, Hirakata; Shigeyuki Okamoto, Kobe, both of Japan

[73] Assignee: Sanyo Electric Co., Ltd., Moriguchi, Japan

[21] Appl. No.: 08/942,980

[22] Filed: Oct. 2, 1997

[30] Foreign Application Priority Data

Oct. 4, 1996 [JP] Japan .................................. 8-264498
Aug. 28, 1997 [JP] Japan .................................. 9-231984

[51] Int. Cl.⁶ .............................. H03F 3/68; H03F 3/04
[52] U.S. Cl. ........................................ 330/295; 330/302
[58] Field of Search ................................ 330/286, 295, 330/302, 307, 277

[56] References Cited

U.S. PATENT DOCUMENTS

| | | | |
|---|---|---|---|
| 4,803,443 | 2/1989 | Takagi et al. | 330/277 |
| 5,111,157 | 5/1992 | Komiak | 330/286 |
| 5,420,537 | 5/1995 | Weedon et al. | 330/251 |
| 5,528,209 | 6/1996 | Macdonald et al. | 333/247 |
| 5,694,085 | 12/1997 | Walker | 330/295 |

OTHER PUBLICATIONS

1983 IEEE Monolithic Circuit Syposium Digest; pp. 62-6-66.
1987 IEEE GaAs IC Symposium; pp. 215–218.
1988 IEEE MTT–S Digest; pp. 175–178.
1988 IEEE MTT–S Digest; pp. 179–182.
1990 IEEE transactions on microwave theory and techniques, vol. 38, No. 3, pp. 270–275.
1993 IEEE GaAs IC Symposium; pp. 355–358.
Proceedings of the 1997 Electronics Society Conference of IEICE.

*Primary Examiner*—Robert Pascal
*Assistant Examiner*—Patricia T. Nguyen
*Attorney, Agent, or Firm*—Armstrong, Westerman, Hattori, McLeland & Naughton

[57] ABSTRACT

A plurality of FETs have their respective gates connected to each other through a first line and their respective drains connected to each other through a second line. A gate bias is applied to the gate of each FET through the first line and a drain bias is applied to the drain of each FET through the second line. A first matching circuit includes first capacitors connected to the signal path, inductors each connected between one end of each first capacitor and the ground potential, and second capacitors each connected between the other end of each first capacitor and the ground potential. The second matching circuit includes first capacitors each connected to the signal path, second capacitors each connected between one end of each first capacitor and the ground potential, and inductors each connected between the other end of each first capacitor and the ground potential.

28 Claims, 17 Drawing Sheets

POWER AMPLIFIER AND CHIP CARRIER

BACKGROUND OF THE INVENTION

1. Field of the Invention

The present invention relates to a power amplifier using a plurality of transistors and a chip carrier on which a plurality of transistor chips are mounted.

2. Description of the Related Art

Power amplifiers using a plurality of transistors are used in transmitting/receiving devices for use in microwave communication systems, for example. FIG. 21 is a circuit diagram showing an example of a conventional power amplifier using a plurality of MESFETs (Metal Semiconductor Field-Effect Transistors, referred to simply as EFT hereinafter).

The power amplifier shown in FIG. 21 includes four FETs 1, a divider 41, a first matching circuit 42, a second matching circuit 51, and a combiner 52.

The four chips of the FETs 1 are mounted on a chip carrier 60. A plurality of $\lambda/8$ lines SL1, SL3, a plurality of capacitors CA, C1, and a resistor R are provided on a substrate 40. A plurality of $\lambda/8$ lines SL2, SL4, SL7 and a plurality of capacitors CB, C2 are provided on a substrate 50.

An input pad PI on the substrate 40 is connected to a node NI through the capacitor C1 and the resistor R is connected between the node NI and a gate-bias Pad PVg. Connected to the gate-bias pad PVg are a gate-bias power-supply Vg and a capacitor Cg for stabilization of the power-supply voltage.

The node NI is connected to two nodes N1 through the two $\lambda/8$ lines SL3. Each node N1 is connected to two pads PA through two $\lambda/8$ lines SL1. Each pad PA is grounded through a capacitor CA. Each pad PA is connected to the gate of each FET 1 through a bonding wire BWA.

An output pad PO on the substrate 50 is connected to a node NO through the capacitor C2 and the node NO is connected to a drain-bias pad PVd through the $\lambda/4$ line SL7. Connected to the drain-bias pad PVd are a drain-bias power-supply Vd, an end of the $\lambda/4$ line SL7, and a capacitor Cd for stabilization of the power-supply voltage.

The node NO is connected to two nodes N2 through the two $\lambda/8$ lines SL4. Each of the nodes N2 is connected to two pads PB through two $\lambda/8$ lines SL2. Each of the pads PB is grounded through each capacitor CB. Each pad PB is connected to the drain of each FET 1 through a bonding wire BWB.

The $\lambda/8$ lines SL3, SL1 on the substrate 40 form the divider 41 and the capacitors CA and the bonding wires BWA form the matching circuit 42. The bonding wires BWB and the capacitors CB form the matching circuit 51 and the $\lambda/8$ lines SL2, SL4 on the substrate 50 form the combiner 52.

A gate bias is applied to the gate of each FET 1 from the gate-bias power-supply Vg through the $\lambda/8$ lines SL3, SL1 in the divider 41 and the bonding wires BWA. A drain bias is applied to the drain of each FET 1 from the drain-bias power-supply Vd through the $\lambda/8$ lines SL4, SL2 in the combiner 52 and the bonding wires BWB.

An RF signal (high-frequency signal) applied to the input pad PI is distributed by the divider 41 and applied to the gates of the four FETs 1, and the RF signals amplified in the FETs 1 are outputted from their respective drains. The RF signals outputted from the drains of the four FETs 1 are combined in the combiner 52 and outputted from the output pad PO. The matching circuit 42 obtains an impedance match between the divider 41 and each FET 1 and the matching circuit 51 obtains an impedance match between each FET 1 and the combiner 52.

In the above-described conventional power amplifier, the drain bias is applied to the drains of the plurality of FETs 1 through the $\lambda/8$ lines SL4, SL2 in the combiner 52 and the bonding wires BWB. In this case, since the $\lambda/8$ lines SL4, SL2 have a resistance component, the drain current causes a voltage drop, which leads to large loss.

Further, since the bonding wires BWB form the matching circuit 51, it is not possible to arbitrarily increase the number of the bonding wires BWB. Then the bonding wires BWB may be disconnected if an overcurrent flows therethrough. Moreover, it is not easy to arbitrarily adjust the value of the inductor (wire inductor) of the bonding wires BWB, leading to difficulties in designing and adjusting the matching circuit 51. Furthermore, if the plurality of FETs 1 have variations in gate capacitance, it is likely to cause low-frequency oscillation.

SUMMARY OF THE INVENTION

An object of the present invention is to provide a power amplifier which enables reduction in the loss caused by application of a DC bias and prevents disconnection, and which allows the matching circuits to be designed and adjusted with ease, and a chip carrier used therein.

Another object of the present invention is to provide a power amplifier which prevents low-frequency oscillation caused by variations in capacitance among a plurality of transistors and a chip carrier used therein.

A further object of the present invention is to provide a power amplifier which prevents low-frequency oscillation caused by variations in capacitance among a plurality of transistors and is capable of suppressing high-frequency oscillation.

A power amplifier according to the present invention includes: a plurality of transistors each having an input electrode, an output electrode, and a ground electrode; a divider for distributing an input AC signal to the input electrodes of the plurality of transistors; a first matching circuit for obtaining an impedance match between each of the plurality of transistors and the divider; a combiner for combining AC signals outputted from the output electrodes of the plurality of transistors; a second matching circuit for obtaining an impedance match between each of the plurality of transistors and the combiner; a line provided separately from the combiner, for interconnecting the output electrodes of the plurality of transistors; and a DC bias input portion receiving a DC bias, for applying the DC bias to the output electrodes of the plurality of transistors through the line without through the combiner and the second matching circuit.

In this power amplifier, the input AC signal is distributed by the divider and applied to the input electrodes of the plurality of transistors, and amplified in the transistors and outputted from the output electrodes. The AC signals outputted from the output electrodes of the plurality of transistors are combined by the combiner and outputted.

Particularly, the output electrodes of the plurality of transistors are mutually connected through the line and a DC bias inputted from the DC bias input portion is applied to the output electrodes of the transistors through the line. Thus the AC signal outputted from the output electrode of each transistor and the DC bias applied to the output electrode of each transistor are separated.

Since the DC bias is thus applied to the output electrode of each transistor without passing through the combiner and the matching circuit, the DC current causes a reduced voltage drop, and hence reduced loss.

Furthermore, since no DC current flows through the signal path in the second matching circuit, it is possible to insert capacitors in the signal path of the second matching circuit. In this case, the second matching circuit can be constructed by connecting inductors between the capacitors inserted in the signal path and the ground potential. This eliminates the necessity of utilizing wire inductors connected between the output electrodes of the transistors and the second matching circuit to match the impedances. Then the number of wire inductors can be arbitrarily adjusted to prevent disconnection due to excess current.

Moreover, since the impedance of the second matching circuit can be adjusted with capacitances of the capacitors, the second matching circuit can easily be designed and adjusted.

The second matching circuit may include a plurality of capacitors each connected between the output electrode of each of the plurality of transistors and the combiner, and a plurality of inductors each connected between a connection between the combiner and each of the plurality of capacitors and a ground potential.

In this case, it is not necessary to utilize wire inductors connected between the output electrodes of the transistors and the matching circuit to obtain an impedance match, and therefore it is possible to arbitrarily adjust the number of the wire inductors to prevent disconnection due to excess current. Furthermore, the impedance of the second matching circuit can be adjusted with capacitances of the capacitors, which facilitates design and adjustment of the second matching circuit.

The second matching circuit may include a plurality of first capacitors each connected between the output electrode of each of the plurality of transistors and the combiner, a plurality of second capacitors each connected between one end of each of the plurality of first capacitors and a ground potential, and a plurality of inductors each connected between the other end of each of the plurality of first capacitors and the ground potential.

In this case, it is not necessary to utilize wire inductors connected between the output electrodes of the transistors and the matching circuit to match the impedances, and therefore it is possible to arbitrarily adjust the number of the wire inductors to prevent disconnection due to overcurrent. Furthermore, since the impedance of the second matching circuit can be adjusted with capacitances of the first and second capacitors, the second matching circuit can be designed and adjusted easily. In this case, there are plural kinds of combinations of circuit constants which can provide the same amplifier characteristic, which provides increased design freedom.

The DC bias input portion may be connected to a middle point of the line between the output electrodes of each adjacent two of the transistors.

In this case, the path for supplying the DC bias to the output electrodes of the two adjacent transistors has symmetry, which allows the plurality of transistors to operate under the same bias condition. This improves the high-frequency characteristic of the power amplifier.

The input electrode may be a gate electrode or a base electrode, the output electrode may be a drain electrode or a collector electrode, and the ground electrode may be a source electrode or an emitter electrode.

The plurality of transistors may be mounted on a chip carrier. The plurality of transistors may be individually accommodated in packages.

A power amplifier according to another aspect of the present invention includes: a plurality of transistors each having an input electrode, an output electrode, and a ground electrode; a divider for distributing an input AC signal to the input electrodes of the plurality of transistors; a first matching circuit for obtaining an impedance match between each of the plurality of transistors and the divider; a combiner for combining AC signals outputted from the output electrodes of the plurality of transistors; a second matching circuit for obtaining an impedance match between each of the plurality of transistors and the combiner; a line provided separately from the divider, for interconnecting the input electrodes of the plurality of transistors; and a DC bias input portion receiving a DC bias, for applying the DC bias to the input electrodes of the plurality of transistors through the line without through the divider and the first matching circuit.

In this power amplifier, the input AC signal is distributed by the divider and applied to the input electrodes of the plurality of transistors, and amplified in the transistors and outputted from the output electrodes. The AC signals outputted from the output electrodes of the plurality of transistors are combined by the combiner and outputted.

Particularly, the input electrodes of the plurality of transistors are mutually connected through the line and a DC bias inputted from the DC bias input portion is applied to the input electrode of each transistor through the line. Thus the AC signal inputted to the input electrode of each transistor and the DC bias applied to the input electrode of each transistor are separated.

Thus, since no DC current flows through the signal path in the first matching circuit, it is possible to insert capacitors in the signal path of the first matching circuit. In this case, the first matching circuit can be constructed by connecting inductors between the capacitors inserted in the signal path and the ground potential. Then, since the capacitor of the first matching circuit and the capacitance of the transistor are connected in parallel to the input electrode of each transistor, the capacitance value seen from the input electrode is large. This results in a reduction in variations in capacitance value among the plurality of transistors, which prevents the low-frequency oscillation.

Moreover, the impedance of the first matching circuit can be adjusted with capacitances of the capacitors, so that the first matching circuit can easily be designed and adjusted.

The first matching circuit may include a plurality of capacitors each connected between the divider and the input electrode of each of the plurality of transistors, and a plurality of inductors each connected between a connection between the divider and each of the plurality of capacitors and a ground potential.

In this case, the capacitance value seen from the input electrode of each transistor is large, which reduces variations in capacitance value among the plurality of transistors. This prevents the low-frequency oscillation of the transistors. Furthermore, since it is possible to adjust the impedance of the first matching circuit with capacitances of the capacitors, the first matching circuit can be designed and adjusted easily.

The first matching circuit may include a plurality of first capacitors each connected between the divider and the input electrode of each of the plurality of transistors, a plurality of inductors each connected between one end of each of the plurality of first capacitors and a ground potential, and a plurality of second capacitors each connected between the other end of each of the plurality of first capacitors and the ground potential.

In this case, the capacitance value seen from the input electrode of each transistor is large, which reduces variations in capacitance value among the plurality of transistors. This prevents the low-frequency oscillation of the transistors. Moreover, since this first matching circuit is a band-pass type matching circuit, this circuit has the advantage of facilitating suppression of the high-frequency oscillation. Furthermore, since it is possible to adjust the impedance of the first matching circuit with capacitances of the first and second capacitors, the first matching circuit can be designed and adjusted easily. In this case, there are plural kinds of combinations of circuit constants capable of obtaining the same amplifier characteristic, which increases the design freedom.

The DC bias input portion may be connected to a middle point of the line between the input electrodes of each adjacent two of the transistors.

In this case, the path for supplying the DC bias to the input electrodes of the two adjacent transistors has symmetry, which allows the plurality of transistors to operate under an equal bias condition. This improves the high-frequency characteristic of the power amplifier.

The input electrode may be a gate electrode or a base electrode, the output electrode may be a drain electrode or a collector electrode, and the ground electrode may be a source electrode or an emitter electrode.

The plurality of transistors may be mounted on a chip carrier. The plurality of transistors may be individually accommodated in packages.

A power amplifier according to a further aspect of the present invention includes: a plurality of transistors each having an input electrode, an output electrode, and a ground electrode; a divider for distributing an input AC signal to the input electrodes of the plurality of transistors; a first matching circuit for obtaining an impedance match between each of the plurality of transistors and the divider; a combiner for combining AC signals outputted from the output electrodes of the plurality of transistors; a second matching circuit for obtaining an impedance match between each of the plurality of transistors and the combiner; a first line provided separately from the divider, for interconnecting the input electrodes of the plurality of transistors; a second line provided separately from the combiner, for interconnecting the output electrodes of the plurality of transistors; a first DC bias input portion receiving a first DC bias, for applying the first DC bias to the input electrodes of the plurality of transistors through the first line without through the divider and the first matching circuit; and a second DC bias input portion receiving a second DC bias, for applying the second DC bias to the output electrodes of the plurality of transistors through the second line without through the combiner and the second matching circuit.

In this power amplifier, the input electrodes of the plurality of transistors are mutually connected through the first line and the DC bias inputted from the first DC bias input portion is applied to the input electrodes of the transistors through the first line. The output electrodes of the plurality of transistors are mutually connected through the second line and the DC bias inputted from the second DC bias input portion is applied to the output electrodes of the transistors through the second line. Thus the AC signal inputted to the input electrode of each transistor and the DC bias applied to the input electrode of each transistor are separated and the AC signal outputted from the output electrode of each transistor and the DC bias applied to the output electrode of each transistor are separated.

This way, since no DC current flows through the signal paths in the first and second matching circuits, it is possible to insert capacitors in the signal paths of the first and second matching circuits. In this case, the first and second matching circuits can be constructed by connecting inductors between the capacitors inserted in the signal paths and the ground potential. Then the capacitance value seen from the input electrode of each transistor is large, which reduces variations in capacitance value of the plurality of transistors. This prevents the low-frequency oscillation of the transistors. Further, it is not necessary to utilize wire inductors connected between the output electrodes of the transistors and the second matching circuit for impedance matching, allowing the number of the wire inductors to be arbitrarily adjusted. As a result, disconnection due to excess current can be prevented.

Moreover, the impedances of the first and second matching circuits can be adjusted with capacitances of the capacitors, which eases design and adjustment of the first and second matching circuits.

The second matching circuit may include a plurality of capacitors each connected between the output electrode of each of the plurality of transistors and the combiner, and a plurality of inductors each connected between a connection between the combiner and each of the plurality of capacitors and a ground potential.

In this case, the number of wire inductors can be arbitrarily adjusted to prevent disconnection due to excess current, and the second matching circuit can be easily designed and adjusted.

The second matching circuit may include a plurality of first capacitors each connected between the output electrode of each of the plurality of transistors and the combiner, a plurality of second capacitors each connected between one end of each of the plurality of first capacitors and a ground potential, and a plurality of inductors each connected between the other end of each of the plurality of first capacitors and the ground potential.

In this case, the number of wire inductors can arbitrarily be adjusted to prevent disconnection due to excess current, and the second matching circuit can easily be designed and adjusted. Since there are a plurality of kinds of combinations of circuit constants capable of providing the same amplifier characteristic, the freedom is increased in designing.

The first matching circuit may include a plurality of capacitors each connected between the divider and the input electrode of each of the plurality of transistors, and a plurality of inductors each connected between a connection between the divider and each of the plurality of capacitors and a ground potential.

In this case, low-frequency oscillation of the transistors is prevented and the first matching circuit can be designed and adjusted easily.

The first matching circuit may include a plurality of first capacitors each connected between the divider and the input electrode of each of the plurality of transistors, a plurality of inductors each connected between one end of each of the plurality of first capacitors and a ground potential, and a plurality of second capacitors each connected between the other end of each of the plurality of first capacitors and the ground potential.

In this case, it is possible to prevent the low-frequency oscillation of the transistors and it is easy to prevent the high-frequency oscillation. Furthermore, the first matching circuit can be easily designed and adjusted. Since there are a plurality of kinds of combinations of circuit constants capable of obtaining the same amplifier characteristic, the design freedom is increased.

The first DC bias input portion may be connected to a middle point of the first line between the input electrodes of each adjacent two of the transistors, and the second DC bias input portion may be connected to a middle point of the second line between the output electrodes of each adjacent two of the transistors.

In this case, since the path for supplying the DC bias to the input electrodes of the adjacent two transistors and the path for supplying the DC bias to the output electrodes of the adjacent two transistors have symmetries, the plurality of transistors operate under an equal bias condition. This provides the power amplifier with an improved high-frequency characteristic.

The divider may have 2n output nodes and the combiner may have 2n input nodes; the first matching circuit may include 2n first matching elements each connected to each of the 2n output nodes of the divider and the second matching circuit may include 2n second matching elements each connected to each of the 2n input nodes of the combiner; and the first line may interconnect output-side nodes of the 2n first matching elements and the second line may interconnect input-side nodes of the 2n second matching elements. Here, n is a positive integer.

The plurality of transistors may include 2n transistors corresponding to the 2n first matching elements and the 2n second matching elements; and the input electrode of each transistor may be connected to the output-side node of a corresponding one of the first matching elements and the output electrode of each transistor may be connected to the input-side node of a corresponding one of the second matching elements.

The plurality of transistors may include n transistors; the input electrode of each transistor corresponds to each two of the first matching elements and is connected to a middle point of the first line between the output-side nodes of the corresponding two of the first matching elements, and the output electrode of each transistor corresponds to each two of the second matching elements, and is connected to a middle point of the second line between the input-side nodes of the corresponding two of the second matching elements.

Each first matching element may include a capacitor connected between a corresponding one of the output nodes of the divider and the output-side node, and an inductor connected between a corresponding one of the output nodes of the divider and a ground potential, and each second matching element may include a capacitor connected between the input-side node and a corresponding one of the input nodes of the combiner and an inductor connected between a corresponding one of the input nodes of the combiner and the ground potential.

Each first matching element may further include a capacitor connected between the output-side node and the ground potential, and each second matching element may further include a capacitor connected between the input-side node and the ground potential.

The input electrode may be a gate electrode or a base electrode, the output electrode may be a drain electrode or a collector electrode, and the ground electrode may be a source electrode or an emitter electrode.

The plurality of transistors may be mounted on a chip carrier, and the chip carrier may include a substrate, a first line which is formed on the substrate and to which the input electrodes of the plurality of transistors are connected in common, a second line which is formed on the substrate and to which the output electrodes of the plurality of transistors are connected in common, and a ground conductor which is formed on the substrate and to which the ground electrodes of the plurality of transistors are connected in common.

The plurality of transistors may be individually accommodated in packages.

According to a further aspect of the present invention, a chip carrier on which a plurality of chips of transistors are mounted includes: a substrate; a first line which is formed on the substrate and to which the input electrodes of the plurality of transistors are connected in common, a second line which is formed on the substrate and to which the output electrodes of the plurality of transistors are connected in common, and a ground conductor which is formed on the substrate and to which the ground electrodes of the plurality of transistors are connected in common.

In this chip carrier, the input electrodes of the plurality of transistors can be connected to the first line in common, the output electrodes can be connected to the second line in common, and the ground electrodes can be connected to the ground conductor in common. This allows application of the DC bias to the input electrodes of the plurality of transistors through the first line on the chip carrier, and application of the DC bias to the output electrodes of the plurality of transistors through the second line.

Accordingly, the use of this chip carrier in a power amplifier including a plurality of transistors allows application of the DC bias to the input electrodes of the transistors without passing through the divider and the matching circuit, and application of the DC bias to the output electrodes of the transistors without passing through the combiner and the matching circuit.

This results in reduction in voltage drop caused by the DC current and reduction in loss. Furthermore, inductors can be inserted in the signal paths of the matching circuits, which prevents the low-frequency oscillation due to variations in characteristic among the plurality of transistors and disconnection due to excess current, and facilitates design and adjustment of the matching circuits.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
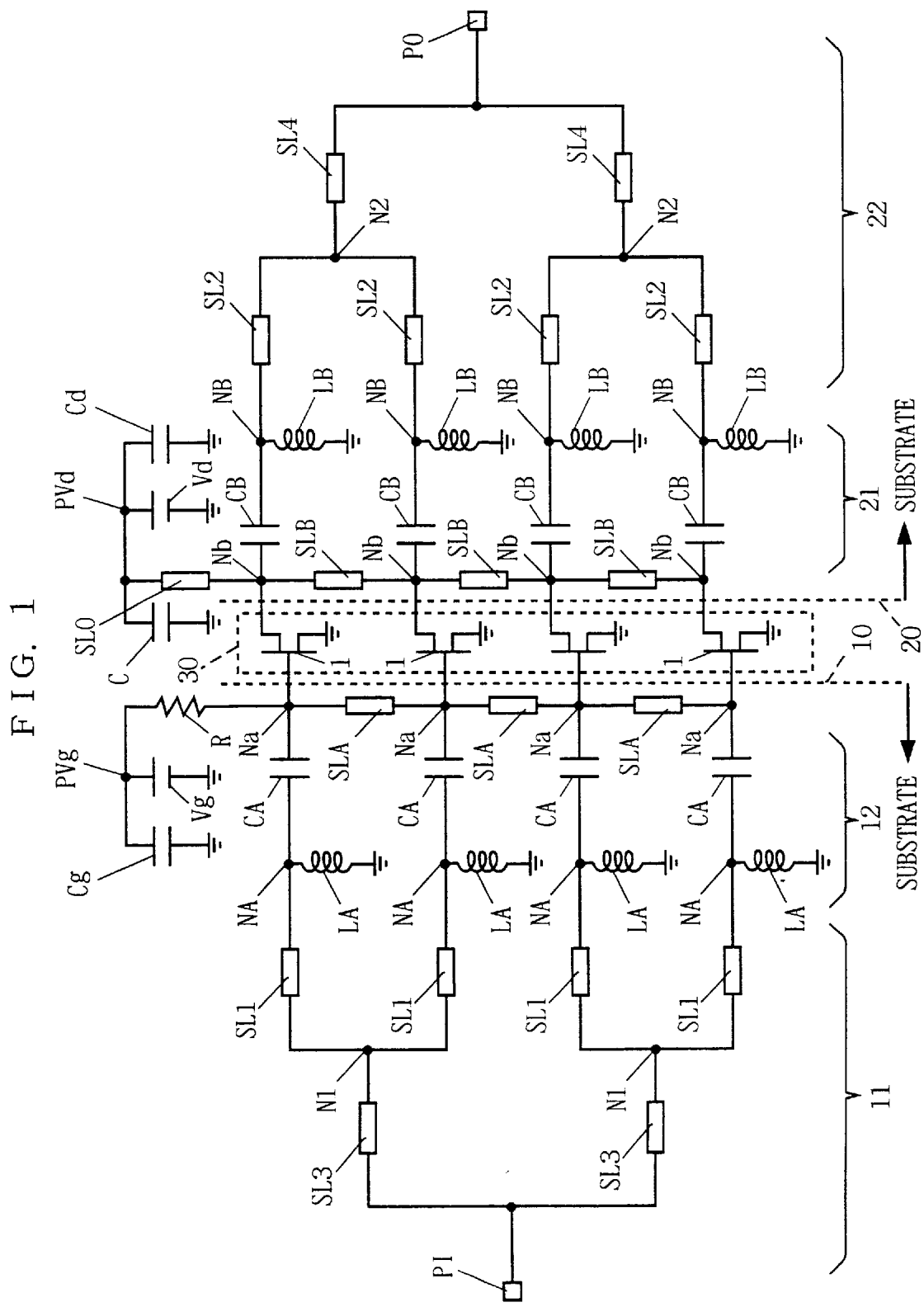
FIG. 1 is a circuit diagram showing the structure of a power amplifier according to a first embodiment of the present invention.
Figure 2:
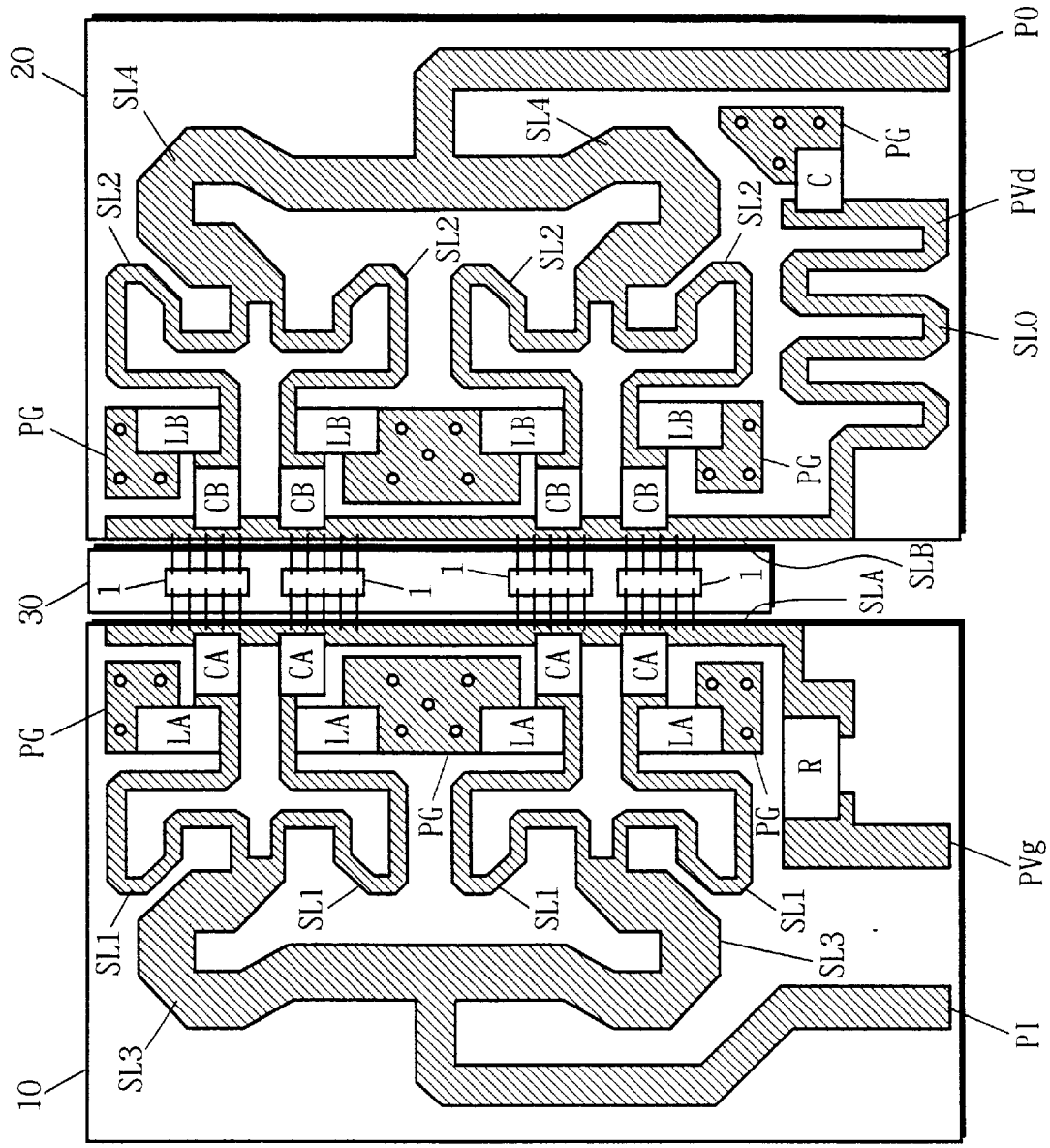
FIG. 2 is a diagram showing the layout pattern of the power amplifier in FIG. 1.

FIG. 1 is a circuit diagram showing the structure of a power amplifier in a first embodiment of the present invention. FIG. 2 is a diagram showing the layout pattern of the power amplifier shown in FIG. 1.

The power amplifier shown in FIG. 1 includes four FETs 1, a divider 11, a matching circuit 12, a matching circuit 21 and a combiner 22. The four chips of the FETs 1 are mounted on a chip carrier 30. A plurality of $\lambda/8$ lines SL1, SL3, a plurality of capacitors CA, a plurality of inductors LA, a resistor R and first lines SLA are provided on a substrate 10. A plurality of $\lambda/8$ lines SL2, SL4, a plurality of capacitors CB, C, a plurality of inductors LB, a $\lambda/4$ line SL0 and second lines SLB are provided on a substrate 20.

An input pad PI on the substrate 10 is connected to two nodes N1 through the two $\lambda/8$ lines SL3. Each node N1 is connected to two nodes NA through two $\lambda/8$ lines SL1. Each node NA is grounded through an inductor LA and is connected to a node Na through a capacitor CA. Each node Na is connected to the gate of an FET 1 through bonding wire. The four nodes Na are connected to each other through the first lines SLA.

The first lines SLA are connected to a gate-bias pad PVg through the resistor R. A gate-bias power-supply Vg and a capacitor Cg for stabilizing the power-supply voltage are connected to the gate-bias pad PVg.

An output pad PO on the substrate 20 is connected to two nodes N2 through the two $\lambda/8$ lines SL4. Each node N2 is connected to two nodes NB through two $\lambda/8$ lines SL2. Each node NB is grounded through an inductor LB and is connected to a node Nb through a capacitor CB. Each node Nb is connected to the drain of an FET 1 through bonding wire. The four nodes Nb are connected to each other through the second lines SLB.

The second lines SLB are connected to the drain-bias pad PVd through the $\lambda/4$ line SL0. Connected to the drain-bias pad PVd are a drain-bias power-supply Vd, an end of the $\lambda/4$ line SL0, and a capacitor Cd for stabilization of the power-supply voltage.

The $\lambda/8$ lines SL3, SL1 on the substrate 10 form the divider 11 and the inductors LA and the capacitors CA on the substrate 10 form the matching circuit 12. The capacitors CB and the inductors LB on the substrate 20 form the matching circuit 21 and the $\lambda/8$ lines SL2, SL4 on the substrate 20 form the combiner 22.

As shown in FIG. 2, in the power amplifier of this embodiment, the first line SLA is formed on one side on the substrate 10 and the second line SLB is formed on one side on the substrate 20. Each FET 1 has its gate connected to the first line SLA through the bonding wire. Each FET 1 has its drain connected to the second line SLB through the bonding wire. The character PG indicates a ground pad.

In the power amplifier of the first embodiment, an RF signal applied to the input pad PI is divided by the divider 11 and is applied to the gates of the four FETs 1, and the RF signals amplified in the FETs 1 are outputted from their respective drains. The RF signals outputted from the drains of the four FETs 1 are combined by the combiner 22 and outputted from the output pad PO.

The matching circuit 12 obtains an impedance match between the divider 11 and each FET 1, and the matching circuit 21 obtains an impedance match between each FET 1 and the combiner 22.

A gate bias is applied to the gate of each FET 1 from the gate-bias power-supply Vg through the resistor R and the first lines SLA. A drain bias is applied to the drain of each FET 1 from the drain-bias power-supply Vd through the $\lambda/4$ line SL0 and the second lines SLB. Thus, the RF signal inputted to the gate of each FET 1 and the gate bias are separated, and the RF signal outputted from the drain of each FET 1 and the drain bias applied to the drain of each FET 1 are separated.

Since the drain bias is thus applied to the drain of each FET 1 without passing through the combiner 22 and the matching circuit 21, the drain current causes a reduced voltage drop, and hence a small loss.

Furthermore, since a direct current does not flow through the signal path of the matching circuit 21, it is possible to insert the capacitors CB in the signal path of the matching circuit 21. In this case, the matching circuit 21 can be formed by connecting the inductors LB between the capacitors CB inserted in the signal path and the ground potential.

Figure 3A:
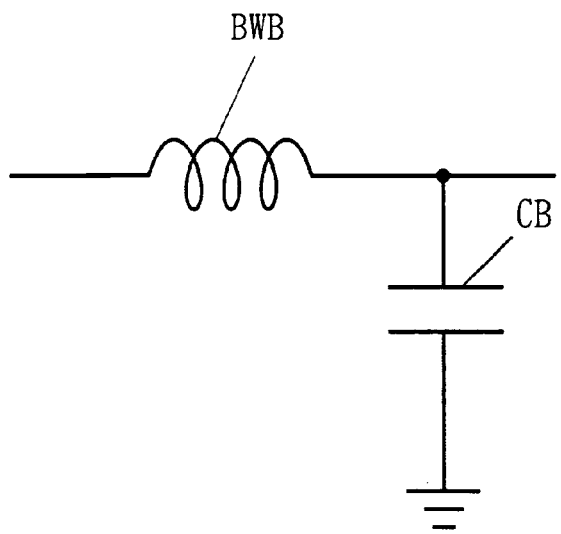
FIG. 3 provides circuit diagrams showing the structure of the matching circuit in a conventional power amplifier and that of the matching circuit in the power amplifier shown in FIG. 1.
Figure 3B:
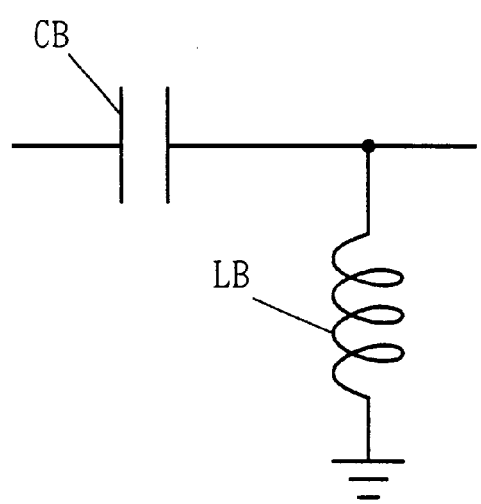
Figure 21:
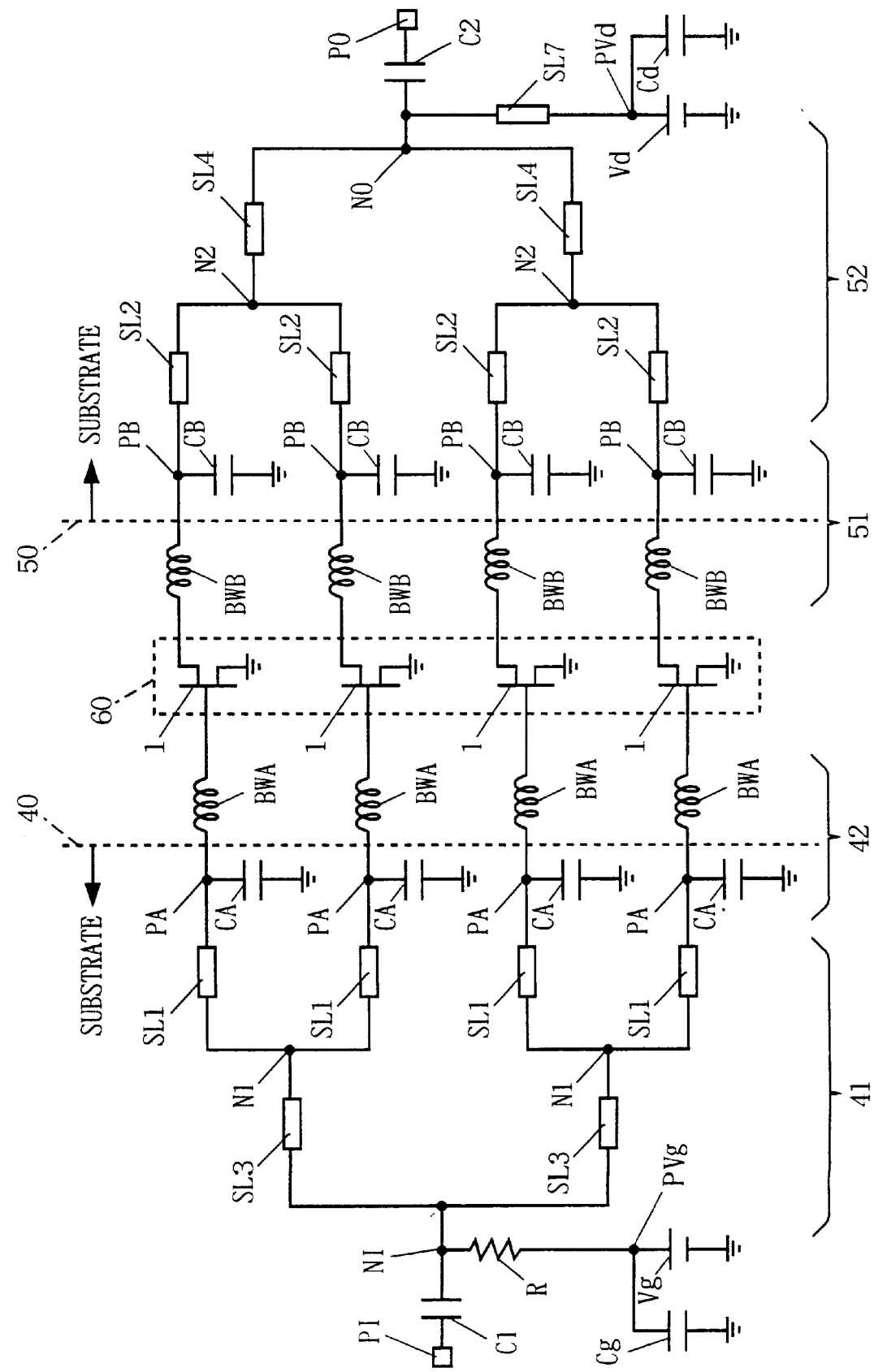
FIG. 21 is a circuit diagram showing the structure of a conventional power amplifier.

FIG. 3(a) is a circuit diagram showing the structure of the matching circuit 51 in the conventional power amplifier shown in FIG. 21, and FIG. 3(b) is a circuit diagram showing the structure of the matching circuit 21 in the power amplifier of this embodiment. As shown in FIG. 3(a), the bonding wire BWB connected to the signal path is used for impedance matching in the matching circuit 51 in the conventional power amplifier. In contrast, as shown in FIG. 3(b), the capacitor CB is inserted in the signal path in the matching circuit 21 of the power amplifier of this embodiment.

This eliminates the necessity of utilizing, for impedance matching, the bonding wires connected between the drains of the FETs 1 and the matching circuit 21. As a result, the number of bonding wires can be arbitrarily adjusted, preventing disconnection of the bonding wires with excess current.

Furthermore, since it is possible to adjust the impedance of the matching circuit 21 with capacitances of the externally mounted capacitors CB, the matching circuit 21 can readily be designed and adjusted.

Moreover, since no direct current flows through the signal path in the matching circuit 12, the capacitors CA can be inserted in the signal path in the matching circuit 12. In this case, the matching circuit 12 can be formed by connecting the inductors LA between the capacitors CA inserted in the signal path and the ground potential.

Figure 4:
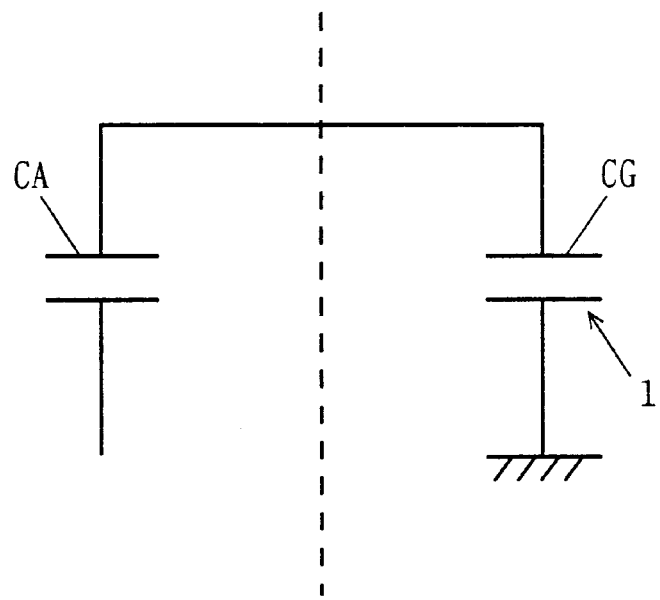
FIG. 4 is a diagram showing the capacitance connected to the gate of each FET of the power amplifier shown in FIG. 1.

FIG. 4 is a diagram showing the capacitances connected to the gate of the FET in the power amplifier of this embodiment. As shown in FIG. 4, the capacitor CA and the gate capacitance CG are connected in parallel to the gate of each FET 1. Accordingly, the capacitance value seen from the gate of the FET 1 is large, which reduces the variations in capacitance value among the plurality of FETs 1. This prevents low-frequency oscillation of the FETs 1.

Moreover, since the impedance of the matching circuit 12 can be adjusted with capacitances of the externally mounted capacitors CA, the matching circuit 12 can be easily designed and adjusted.

Figure 5:
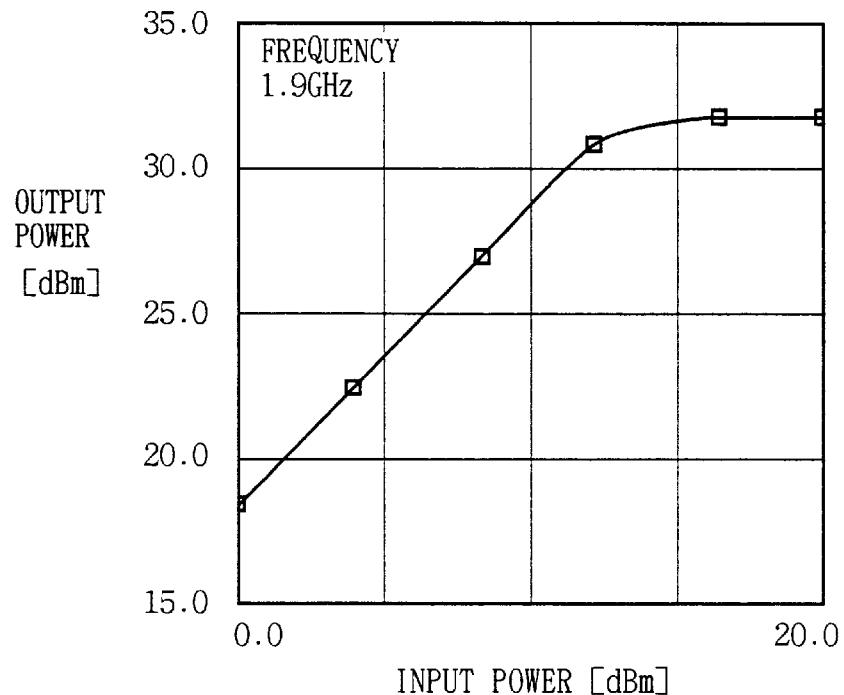
FIG. 5 is a diagram showing the input/output characteristic of a single FET in the power amplifier shown in FIG. 1.

FIG. 5 is a diagram showing the input/output characteristic of a single FET in the power amplifier in FIG. 1. The abscissa in FIG. 5 shows the input power and the ordinate shows the output power. This input/output characteristic shows a result of simulation in which an RF signal having a frequency of 1.9 GHz is inputted.

The characteristic shown in FIG. 5 shows that the input/output characteristic of one FET 1 in the power amplifier of this embodiment is the same as that of one FET 1 in the conventional power amplifier.

Figure 6:
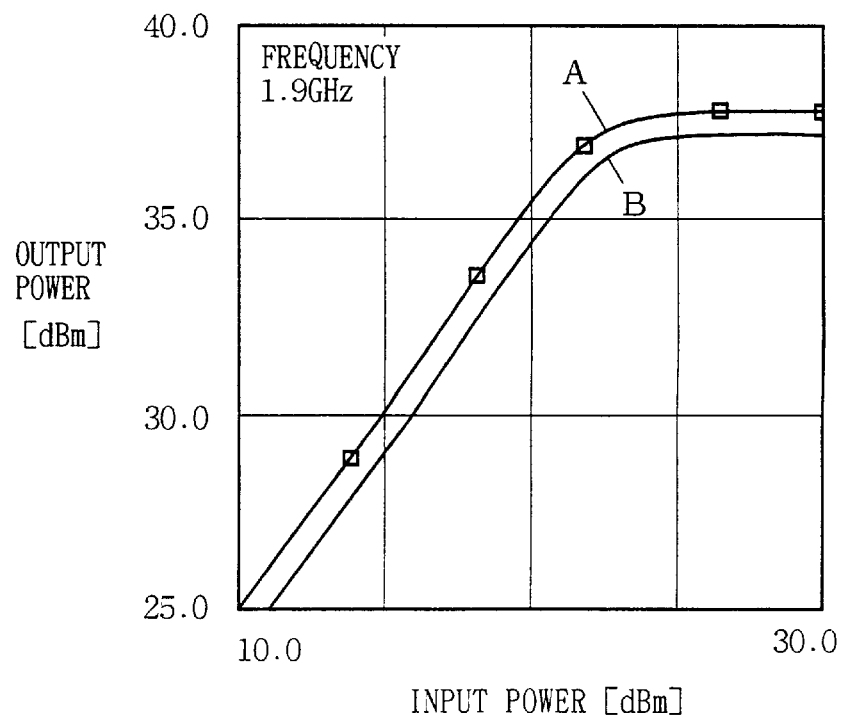
FIG. 6 is a diagram showing the comparison between the input/output characteristic of the power amplifier shown in FIG. 1 and that of the conventional power amplifier.

FIG. 6 is a diagram showing the input/output characteristic of the power amplifier in FIG. 1 in comparison with that of the conventional power amplifier. The abscissa in FIG. 6 shows the input power and the ordinate shows the output power. The input/output characteristics show results of simulation in which an RF signal having a frequency of 1.9 GHz is inputted.

In FIG. 6, the curve A shows the input/output characteristic of the power amplifier of this embodiment and the curve B shows the input/output characteristic of the conventional power amplifier. As shown in FIG. 6, the power amplifier of this embodiment provides an improved input/output characteristic, and hence higher efficiency, as compared with the conventional power amplifier.

Figure 7:
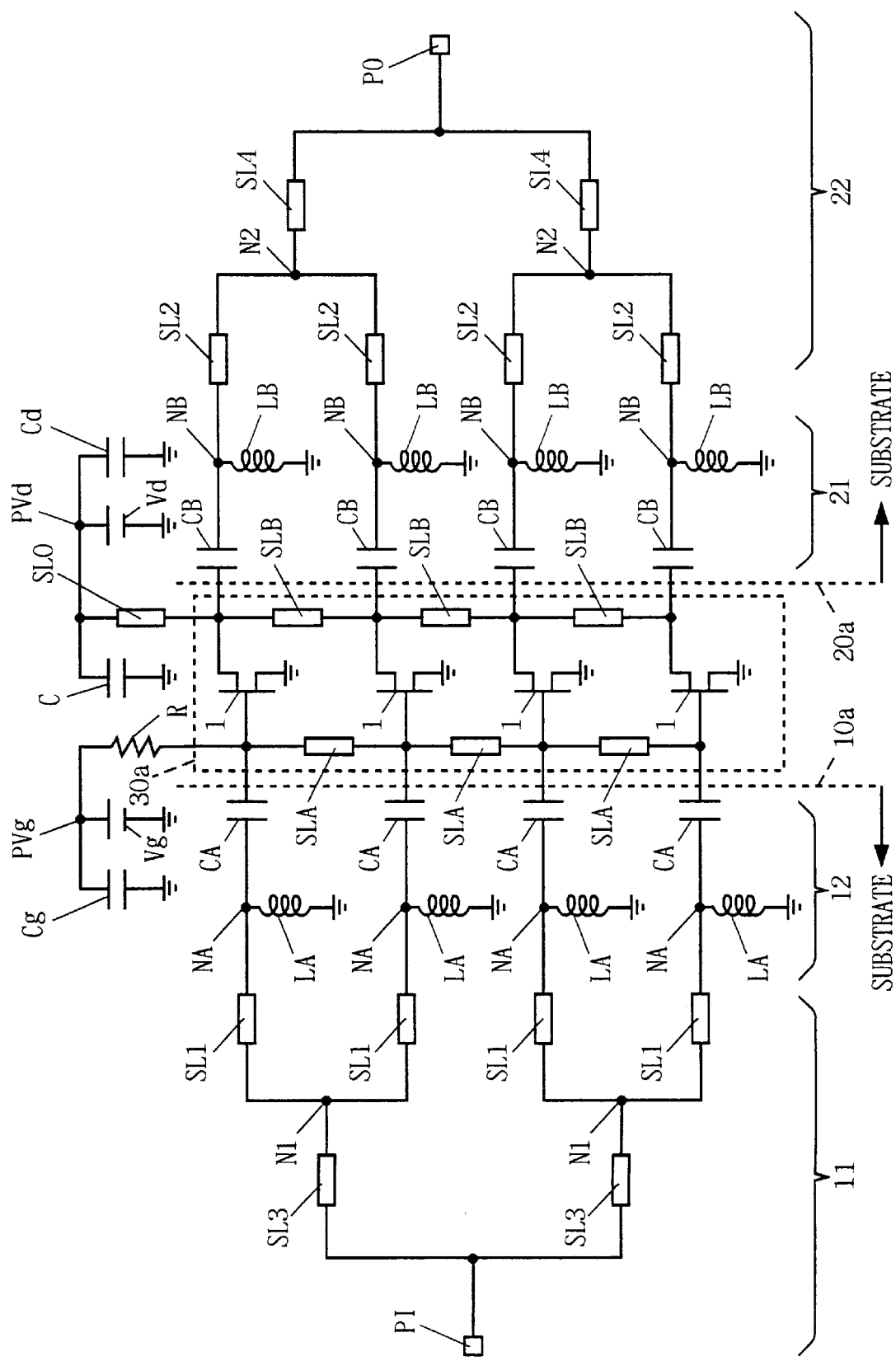
FIG. 7 is a circuit diagram showing the structure of a power amplifier according to a ,second embodiment of the present invention.
Figure 8:
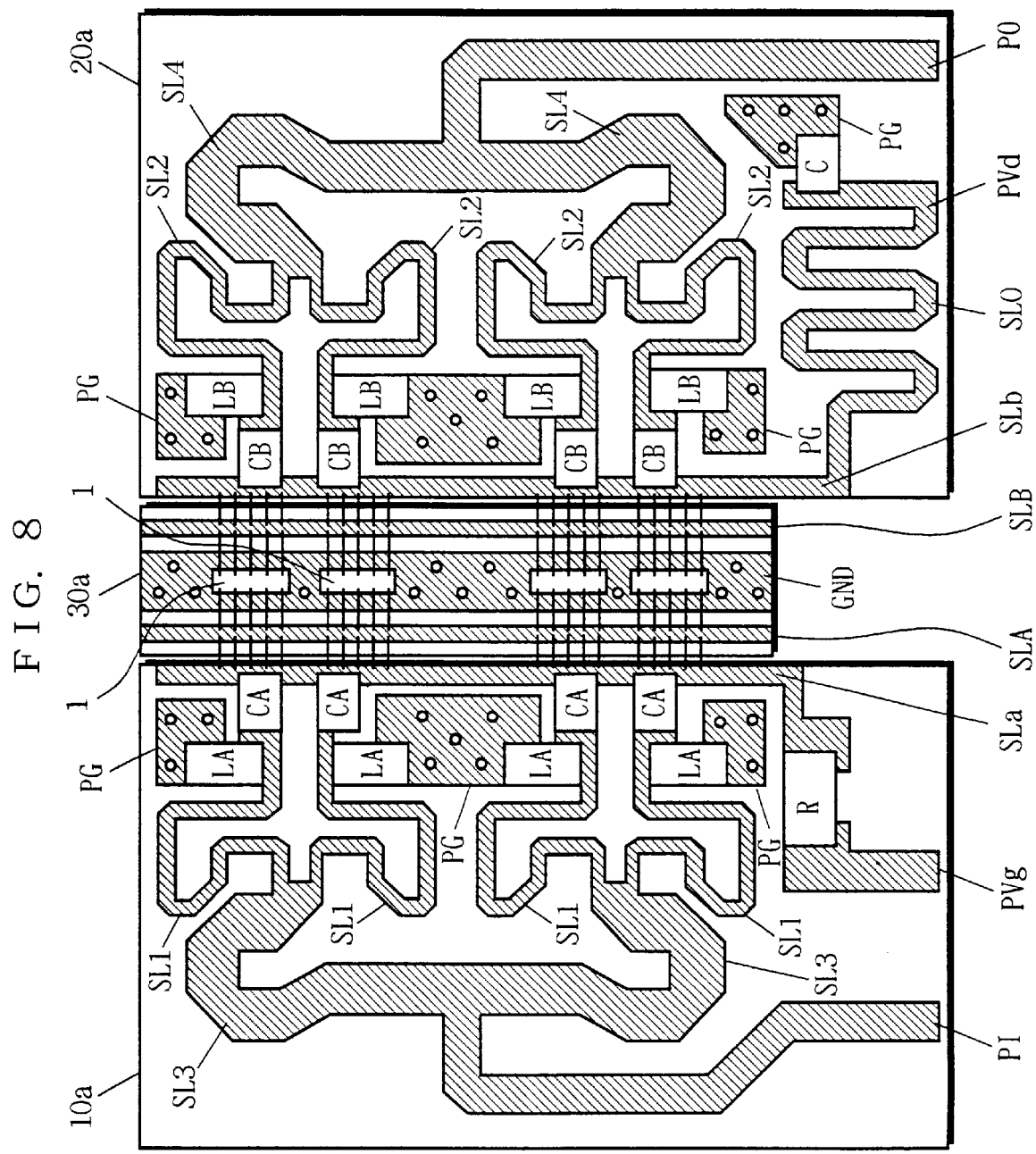
FIG. 8 is a diagram showing the layout pattern of the power amplifier in FIG. 7.

FIG. 7 is a circuit diagram showing the structure of a power amplifier in a second embodiment of the present invention. FIG. 8 is a diagram showing the layout pattern of the power amplifier in FIG. 7.

The power amplifier shown in FIG. 7 differs from that shown in FIG. 1 in that the first lines SLA and the second lines SLB are provided not on the substrates 10a, 20a, but on the chip carrier 30a. In other respects, the structure of the power amplifier shown in FIG. 7 is the same as that of the power amplifier shown in FIG. 1.

As shown in FIG. 8, the first line SLA is formed on one side on the chip carrier 30a and the second line SLB is formed on the other side, and a ground conductor GND is formed in the center part.

Figure 9:
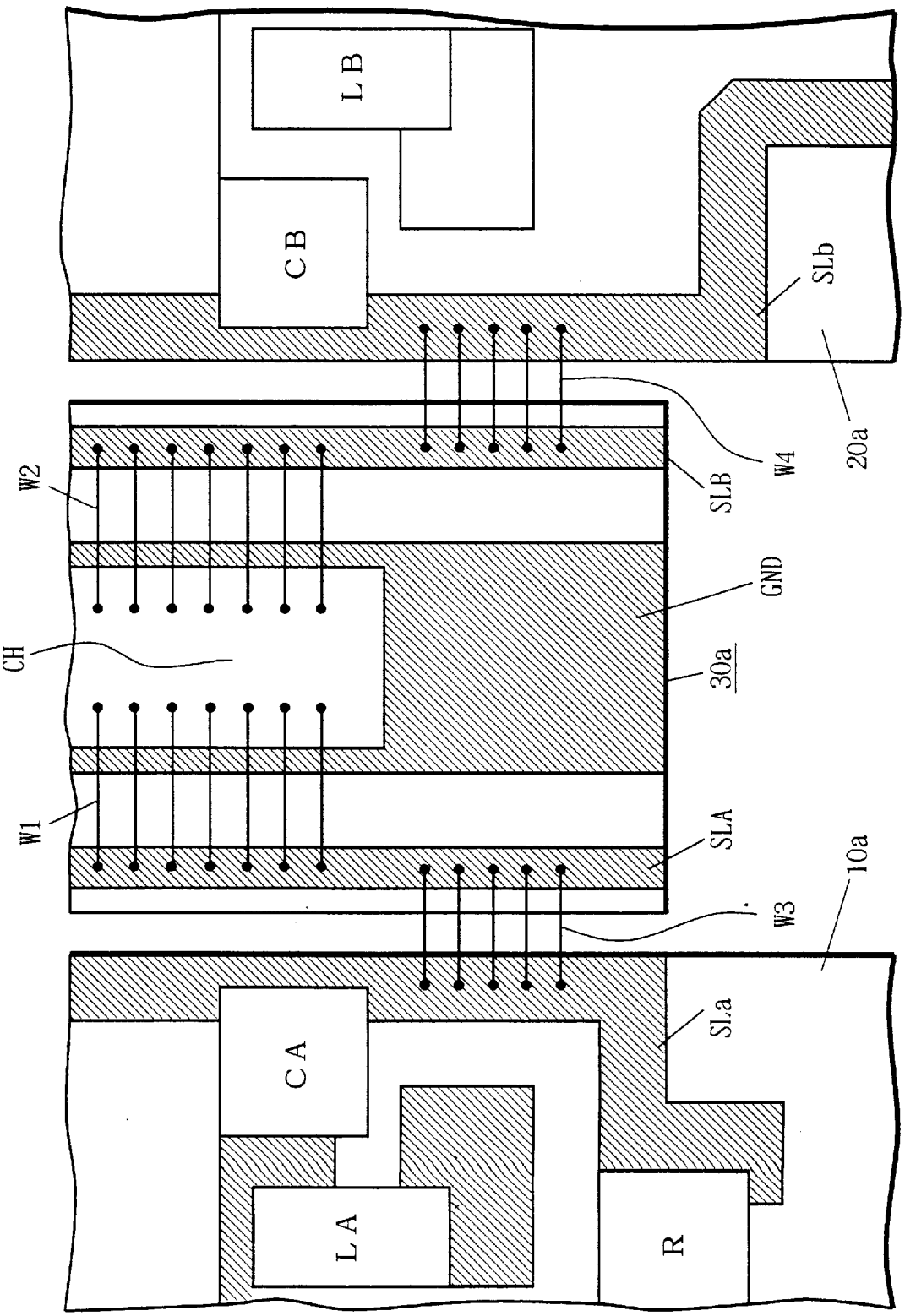
FIG. 9 is an enlarged view showing part of the chip carrier in FIG. 8 and its vicinity.

FIG. 9 is an enlarged view of a part, and its vicinity, of the chip carrier in FIG. 8. As shown in FIG. 9, the plurality of gate electrodes (not shown) of the FET chip CH are connected to the first line SLA on the chip carrier 30a through a plurality of bonding wires W1 and the plurality of drain electrodes (not shown) of the FET chip CH are connected to the second line SLB on the chip carrier 30a through a plurality of bonding wires W2. The first line SLA is connected to a line SLA on the substrate 10a through a plurality of bonding wires W3 and the second line SLB is connected to a line SLB on the substrate 20a through a plurality of bonding wires W4.

In the power amplifier of the second embodiment, the gate bias can be applied to the gates of the four FETs 1 through the first line SLA on the chip carrier 30a and the drain bias can be applied to the drains of the four FETs 1 through the second line SLB.

Figure 10:
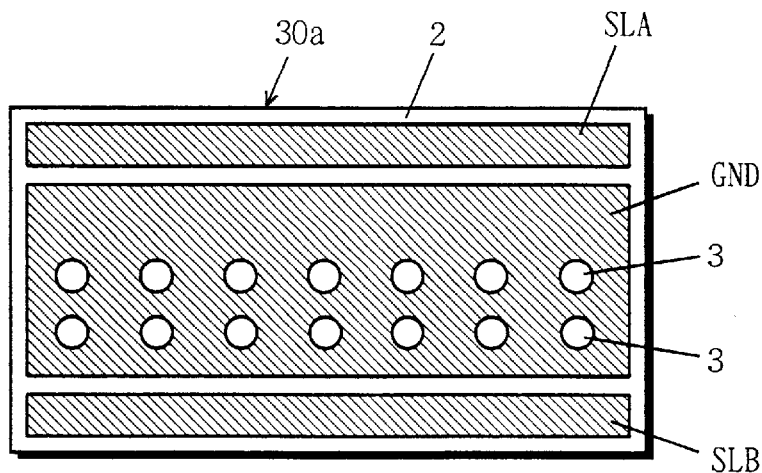
FIG. 10 is a plan showing an example of the chip carrier.

FIG. 10 is a plan showing an example of the chip carrier. In the chip carrier 30a shown in FIG. 10, a stripe-like first line SLA is formed on one side on the surface of the insulating substrate 2 and a stripe-like second line SLB is formed on the other side, and a ground conductor GND is formed in the center part. A plurality of via holes (through holes) 3 are formed in the insulating substrate 2 in the region of the ground conductor GND.

When mounting FET chips on this chip carrier 30a, the source electrodes of the FET chips are bonded to the ground conductor GND, the gate electrodes are connected to the first line SLA through bonding wires, and the drain electrodes are connected to the second line SLB through bonding wires.

Figure 11:
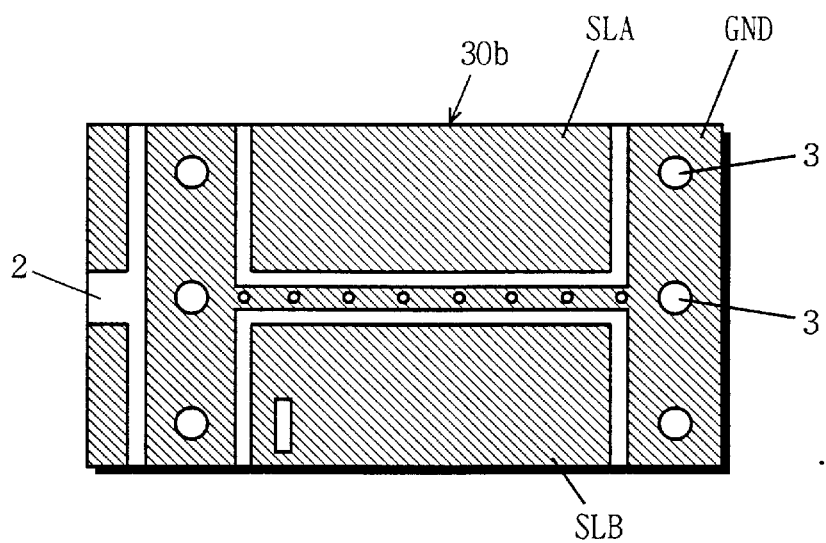
FIG. 11 is a plan showing another example of the chip carrier.

FIG. 11 is a plan showing another example of the chip carrier. In the chip carrier 30b shown in FIG. 11, a rectangular first line SLA is formed on one side on the surface of the insulating substrate 2, a rectangular second line SLB is formed on the other side, and an H-shaped ground conductor GND is formed in the center and in the region on both ends. Via holes 3 are provided in the insulating substrate 2 in the region of the ground conductor GND.

When mounting FET chips on this chip carrier 30b, bumps are formed on the gate electrodes, the drain electrodes, and the source electrodes of the FET chips, and the FET chips are bonded, with their surfaces facing down, on the chip carrier 30b by flip chip mounting.

Figure 12:
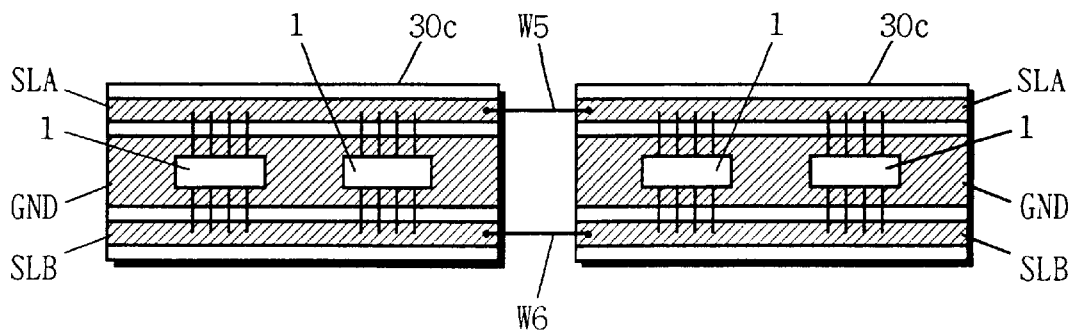
FIG. 12 is a plan showing an example of connection with two chip carriers used.

Although four chips of FETs 1 are mounted on one chip carrier 30a in the second embodiment described above, two chip carriers 30c may be used, with two chips of FETs 1 mounted on each, as shown in FIG. 12. In this case, the first lines SLA of the two chip carriers 30c are connected to each other with the bonding wire W5 and the second lines SLB are connected to each other with the bonding wire W6.

Although the first and second embodiments above have described power amplifiers using four FETs 1, the number of FETs is not limited to that in the embodiments, but other, arbitrary numbers of FETs may be used.

Figure 13:
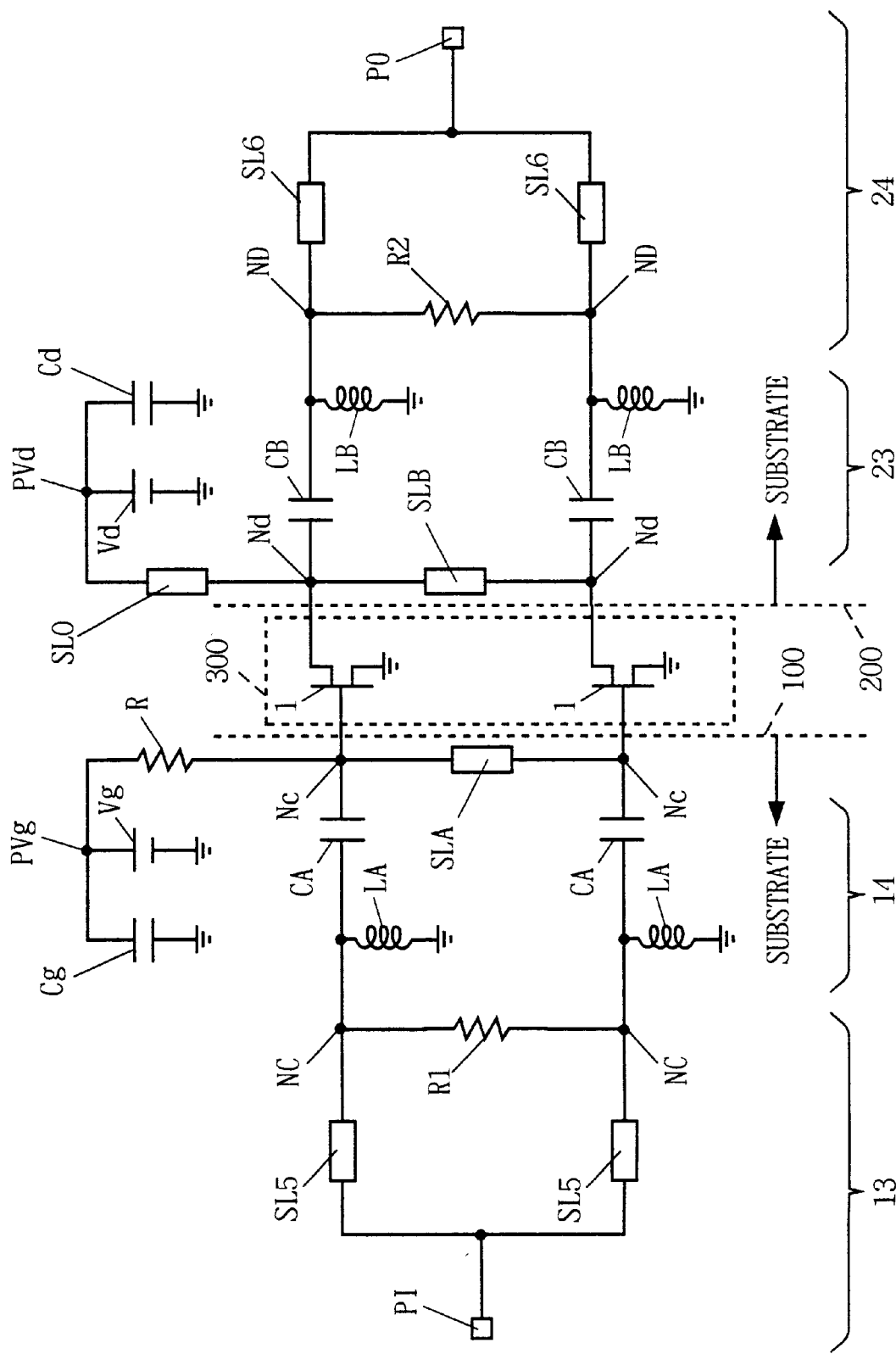
FIG. 13 is a circuit diagram showing the structure of a power amplifier according to a third embodiment of the present invention.

FIG. 13 is a circuit diagram showing the structure of a power amplifier according to a third embodiment of the present invention. The power amplifier in FIG. 13 uses two FETs 1.

The two chips of the FETs 1 are mounted on a chip carrier 300. Provided on a substrate 100 are two λ/4 lines SL5, resistors R1, R, two inductors LA, two capacitors CA and a first line SLA. Provided on a substrate 200 are two λ/4 lines SL6, a resistor R2, two inductors LB, two capacitors CB, a λ/4 line SL0 and a second line SLB.

An input pad PI on the substrate 100 is connected to two nodes NC through the two λ/4 lines SL5, with the resistor R1 connected between the two nodes NC. Each node NC is grounded through an inductor LA and is connected to a node Nc through a capacitor CA. Each node Nc is connected to the gate of an FET 1 through bonding wire. The two nodes Nc are connected to each other through the first line SLA.

The first line SLA is connected to the gate-bias pad PVg through the resistor R. Connected to the gate-bias pad PVg are the gate-bias power-supply Vg and the capacitor Cg.

The output pad PO on the substrate 200 is connected to two nodes ND through the two λ/4 lines SL6, with the resistor R2 connected between the two nodes ND. Each node ND is grounded through an inductor LB and is connected to a node Nd through a capacitor CB. Each node Nd is connected to the drain of an FET 1 through bonding wire. The two nodes Nd are connected to each other through the second line SLB.

The second line SLB is connected to the drain-bias pad PVd through the λ/4 line SL0. Connected to the drain-bias pad PVd are the drain-bias power-supply Vd and the capacitor Cd.

The λ/4 lines SL5 and the resistor R1 on the substrate 100 form a divider 13, and the inductors LA and the capacitors CA on the substrate 100 form a matching circuit 14. The capacitors CB and the inductors LB on the substrate 200 form a matching circuit 23 and the resistor R2 and the λ/4 lines SL6 on the substrate 200 form a combiner 24.

In the power amplifier in the third embodiment, the RF signal applied to the input pad PI is divided by the divider 13 and applied to the gates of the two FETs 1, and the RF signals amplified at the gates of the FETs 1 are outputted from the drains. The RF signals outputted from the drains of the two FETs 1 are combined by the combiner 24 and outputted from the output pad PO.

The matching circuit 14 achieves impedance matching between the divider 13 and each FET 1 and the matching circuit 23 achieves impedance matching between each FET 1 and the combiner 24.

A gate bias is applied to the gate of each FET 1 from the gate-bias power-supply Vg through the resistor R and the first line SLA. A drain bias is applied to the drain of each FET 1 by the drain-bias power-supply Vd through the λ/4 line SL0 and the second line SLB. Thus the RF signal inputted to the gate of each FET 1 and the gate bias are separated and the RF signal outputted from the drain of each FET 1 and the drain bias applied to the drain of each FET 1 are separated.

Since the drain bias is applied to the drain of each FET 1 without passing through the combiner 24 and the matching circuit 23, the voltage drop caused by the drain current is small, and the loss is small.

Furthermore, it is not necessary to utilize, for the matching circuit 23, bonding wires connected between the drains of the FETs 1 and the matching circuit 23, which allows the number of the bonding wires to be arbitrarily adjusted to prevent the bonding wires from being disconnected with an excess current.

Moreover, since the impedance of the matching circuit 23 can be adjusted with the capacitances of the externally mounted capacitors CB, the matching circuit 23 can be designed and adjusted with ease.

Since a capacitor CA is connected to the gate of each FET 1, the capacitance value seen from the gate of the FET 1 is large, which reduces variations in capacitance value among the plurality of FETs 1. This prevents the low-frequency oscillation of the FETs 1. Furthermore, since the impedance of the matching circuit 14 can be adjusted with the capacitances of the externally mounted capacitors CA, the matching circuit 14 can easily be designed and adjusted.

Figure 14:
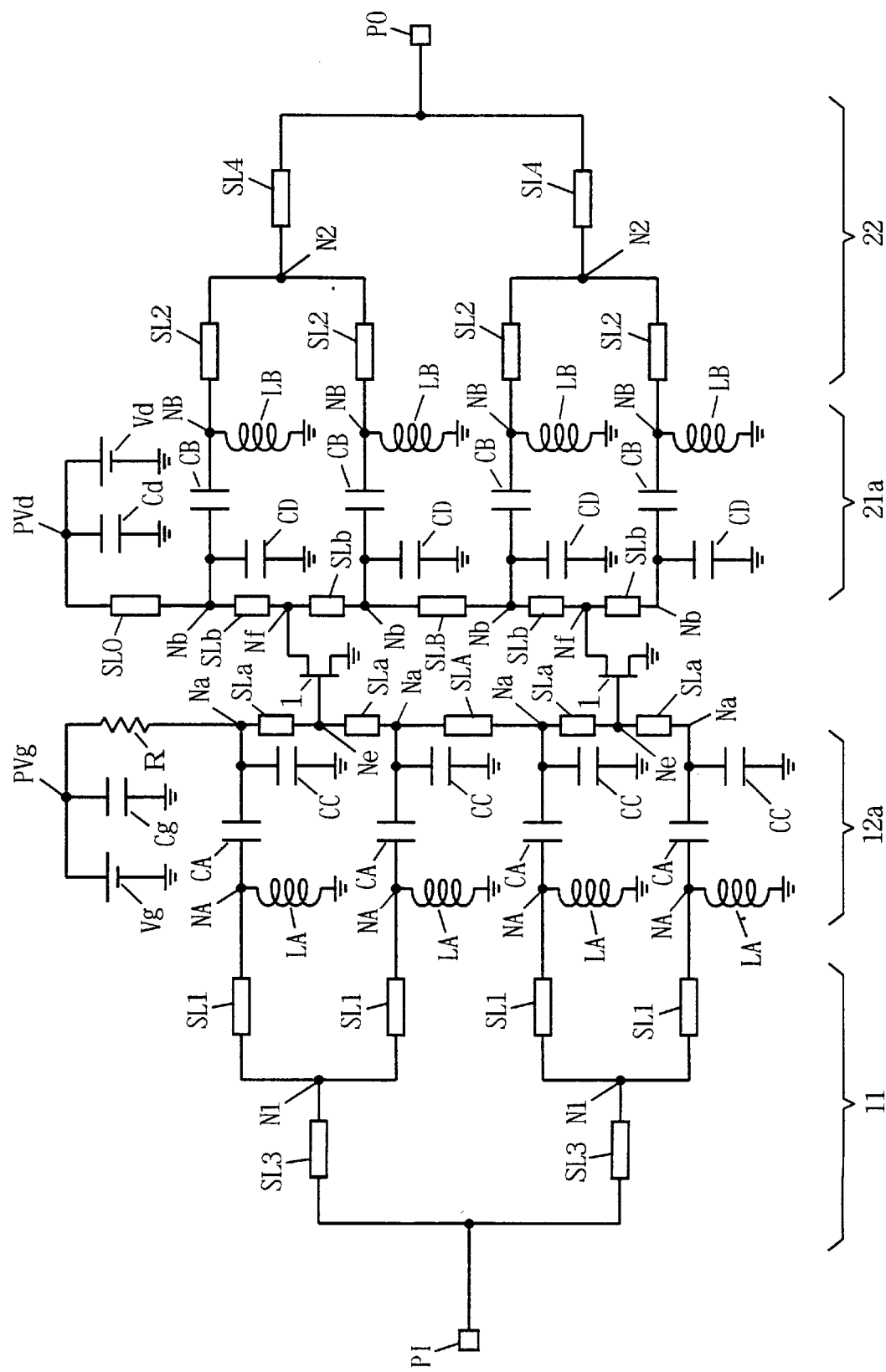
FIG. 14 is a circuit diagram showing the structure of a power amplifier according to a fourth embodiment of the present invention.

FIG. 14 is a circuit diagram showing the structure of a power amplifier in a fourth embodiment of the present invention.

The power amplifier shown in FIG. 14 includes two FETs 1, a divider 11, a matching circuit 12a, a matching circuit 21a, and a combiner 22. The two chips of FETs 1 are not mounted on the chip carrier, but are individually accommodated in packages. The divider 11 and the combiner 22 shown in FIG. 14 have the same structures as those of the divider 11 and the combiner 22 shown in FIG. 1.

The matching circuit 12a is composed of a plurality of capacitors CA, a plurality of inductors LA, and a plurality of capacitors CC. Each capacitor CA is connected between nodes NA and Na, each inductor LA is connected between the node NA and the ground potential, and each capacitor CC is connected between the node Na and the ground potential.

Each set of two nodes Na is related to one FET 1. Two first lines SLa are connected in series between the two nodes Na related to one FET 1. A node Ne between the two first lines SLa is connected to the gate of the corresponding FET 1 through bonding wire. The first line SLA is connected between the adjacent two of the nodes Na corresponding to different FETs 1.

One of the nodes Na is connected to the gate-bias pad PVg through the resistor R. Connected to the gate-bias pad PVg are the gate-bias power-supply Vg and the capacitor Cg for stabilizing the power-supply voltage.

The matching circuit 21a is formed of a plurality of capacitors CB, a plurality of capacitors CD and a plurality of inductors LB. Each capacitor CB is connected between nodes Nb and NB, with each capacitor CD connected between the node Nb and the ground potential and each inductor LB connected between the node NB and the ground potential.

Each two of the nodes Nb are related to one FET 1. Two second lines SLb are connected in series between the two nodes Nb corresponding to one FET 1. A node Nf between the two second lines SLb is connected to the drain of the corresponding FET 1 through bonding wire. The second line SLB is connected between the adjacent two of the nodes Nb corresponding to different FETs 1.

One of the nodes Nb is connected to the drain-bias pad PVd through the λ/4 line SL0. Connected to the drain-bias pad PVd are the drain-bias power-supply Vd, an end of the λ/4 line SL0, and the capacitor Cd for stabilization of the power-supply voltage.

In the power amplifier according to the fourth preferred embodiment, the RF signal applied to the input pad PI is distributed by the divider 11 and is applied to the gates of the two FETs 1 through the first lines SLa, and the RF signals amplified in the FETs 1 are outputted from their respective drains. The RF signals outputted from the drains of the two FETs 1 are applied to the combiner 22 through the second lines SLb and are combined by the combiner 22 and outputted from the output pad PO.

The matching circuit 12a obtains an impedance match between the divider 11 and each FET 1, and the matching circuit 21a obtains an impedance match between each FET 1 and the combiner 22.

A gate bias is applied to the gate of each FET 1 from the gate-bias power-supply Vg through the resistor R and the first lines SLa, SLA. A drain bias is applied to the drain of each FET 1 from the drain-bias power-supply Vd through the λ/4 line SL0 and the second lines SLb, SLB. This separates the RF signal inputted to the gate of each FET 1 and the gate bias, and separates the RF signal outputted from the drain of each FET 1 and the drain bias applied to the drain of each FET 1.

Since the drain bias is applied to the drain of each FET 1 without passing through the combiner 22 and the matching circuit 21a, the drain current causes a reduced voltage drop, thereby enabling reduction in the loss.

In the power amplifier in this embodiment, the chips of the FETs 1 are not mounted on a chip carrier, but are individually encapsulated in packages. Accordingly, when two FETs 1 having almost the same characteristics are selected, for example, it is easy to evaluate the FETs 1.

Figure 15A:
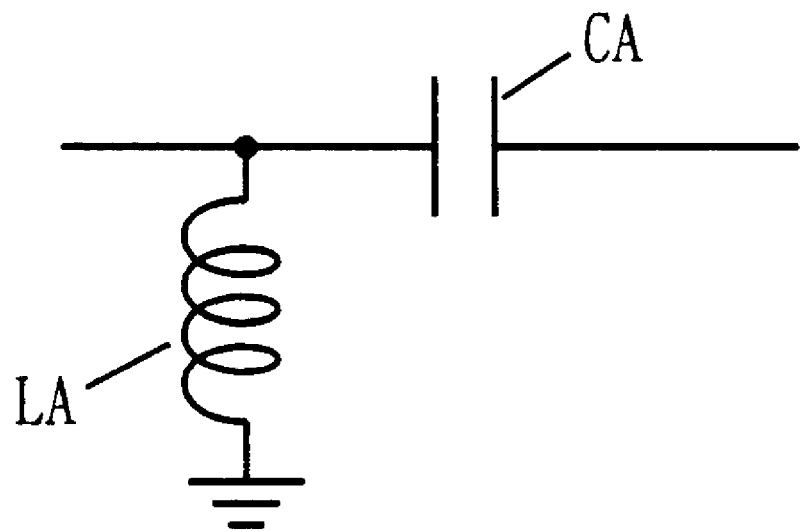
FIG. 15 provides circuit diagrams showing the structure of the matching circuit in the power amplifier in FIG. 1 and that of the matching circuit in the power amplifier in FIG. 14.
Figure 15B:
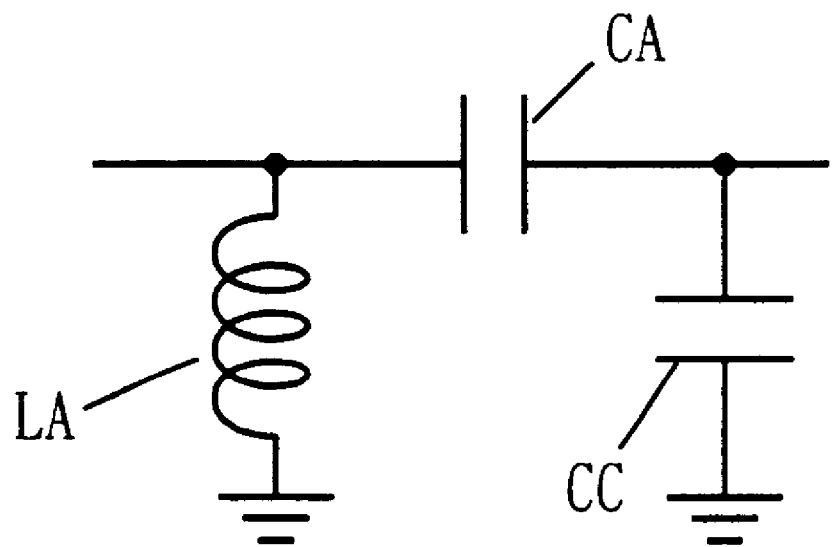

FIG. 15(a) is a circuit diagram showing the structure of the matching circuit 12 in the power amplifier of the first embodiment and FIG. 15(b) is a circuit diagram showing the structure of the matching circuit 12a in the power amplifier of this embodiment.

The matching circuit shown in FIG. 15(a) is a matching circuit of high-pass type and the matching circuit shown in FIG. 15(b) is a matching circuit of band-pass type. The matching circuit in FIG. 15(a) functions, as stated above, to suppress oscillation at oscillation-prone low frequencies. The matching circuit in FIG. 15(b) has the advantage of facilitating suppression of oscillation at high frequencies, in addition to the function of suppressing oscillation at low frequencies.

The impedance of the matching circuit in FIG. 15(a) can be adjusted with capacitance of the externally mounted capacitor CA. The impedance of the matching circuit in FIG. 15(b) can be adjusted with capacitances of the externally mounted capacitors CA, CC.

In the matching circuit in FIG. 15(a), the circuit constant capable of providing the same amplifier characteristic for a particular frequency is uniquely determined. In contrast, in the matching circuit in FIG. 15(b), there are a plurality of kinds of combinations of circuit constants capable of obtaining the same amplifier characteristic for a particular frequency. This increases the design freedom.

Figure 16:
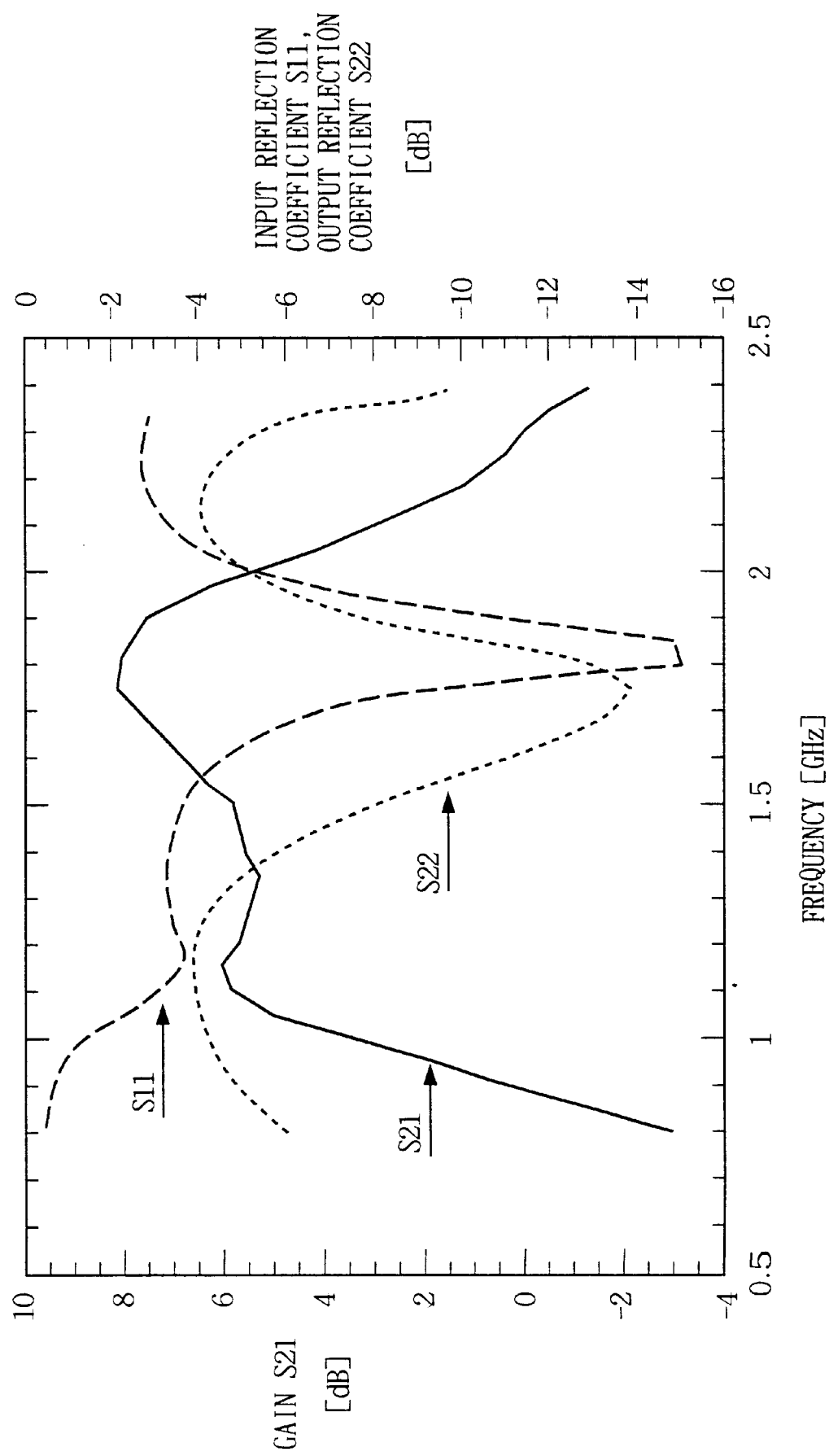
FIG. 16 is a diagram showing the small-signal characteristics of the power amplifier in FIG. 14.

FIG. 16 is a diagram showing small-signal characteristics of the power amplifier of FIG. 14. The small-signal characteristics show results of simulation of the frequency characteristics of S21, S11, and S22. S21 indicates the S parameter representing the gain, S11 indicates the S parameter representing the input reflection coefficient, and S22 indicates the S parameter representing the output reflection coefficient.

Figure 17:
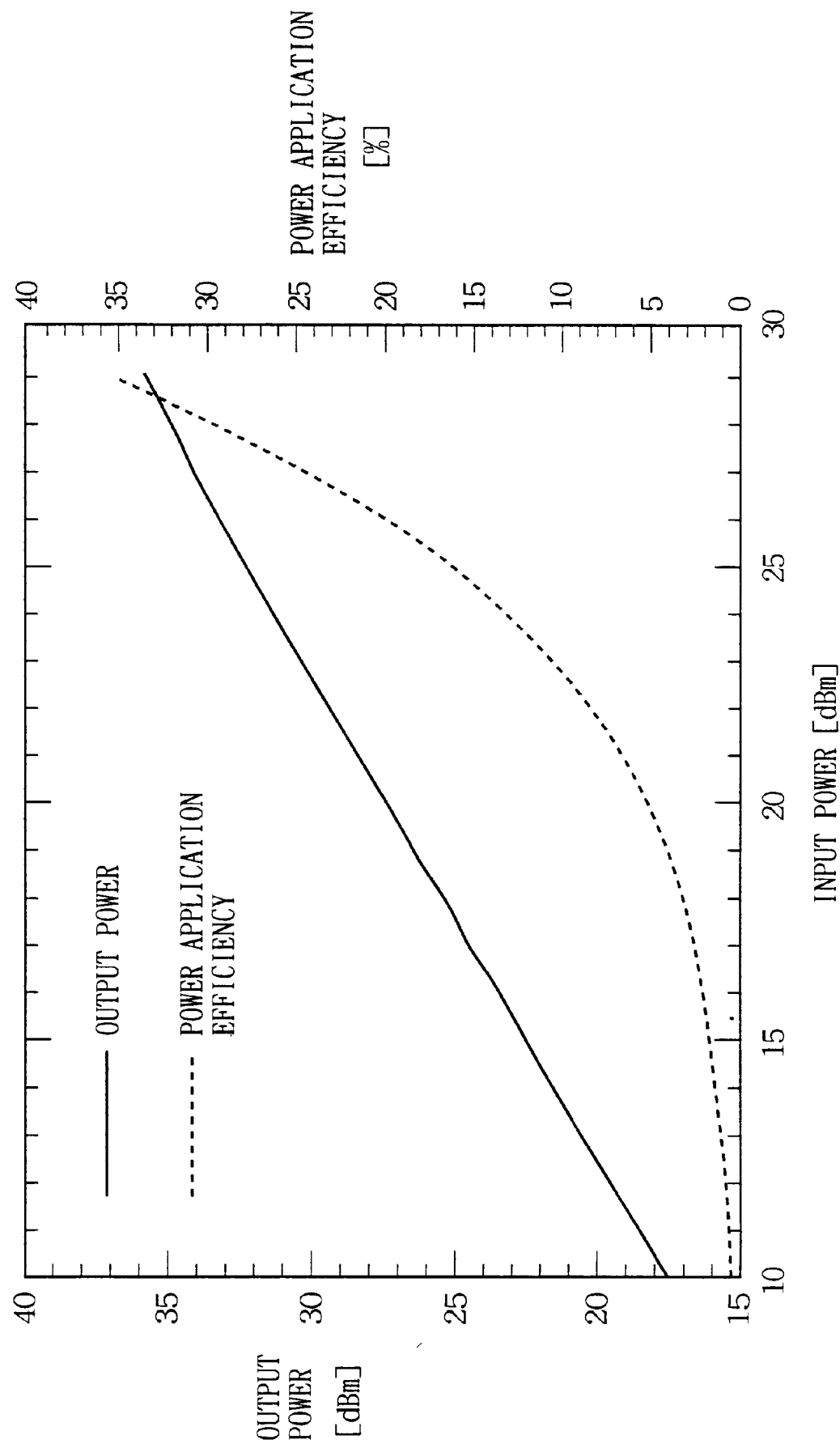
FIG. 17 is a diagram showing the input/output characteristic and the power application efficiency of the power amplifier in FIG. 14.

FIG. 17 is a diagram showing the input/output characteristic and the power application efficiency of the power amplifier shown in FIG. 14. The input/output characteristic and the power application efficiency show results of simulation in which an RF signal at a frequency of 1.9 GHz is inputted.

The small-signal characteristics in FIG. 16 and the input/output characteristic and the power application efficiency shown in FIG. 17 were measured with a drain voltage of 6.5 V for the FET 1, a gate voltage of −2.5 V, and an idle current (a current in the no signal state) of 1.37 A.

The power application efficiency is represented by the equation below.

Power application efficiency [%]=(output power−input power)/(drain voltage×drain current)

The small-signal characteristics shown in FIG. 16 show that the power amplifier in FIG. 14 is at the practical use level. The input/output characteristic and the power application efficiency in FIG. 17, too, show that the power amplifier in FIG. 14 is at the practical use level.

Figure 18:
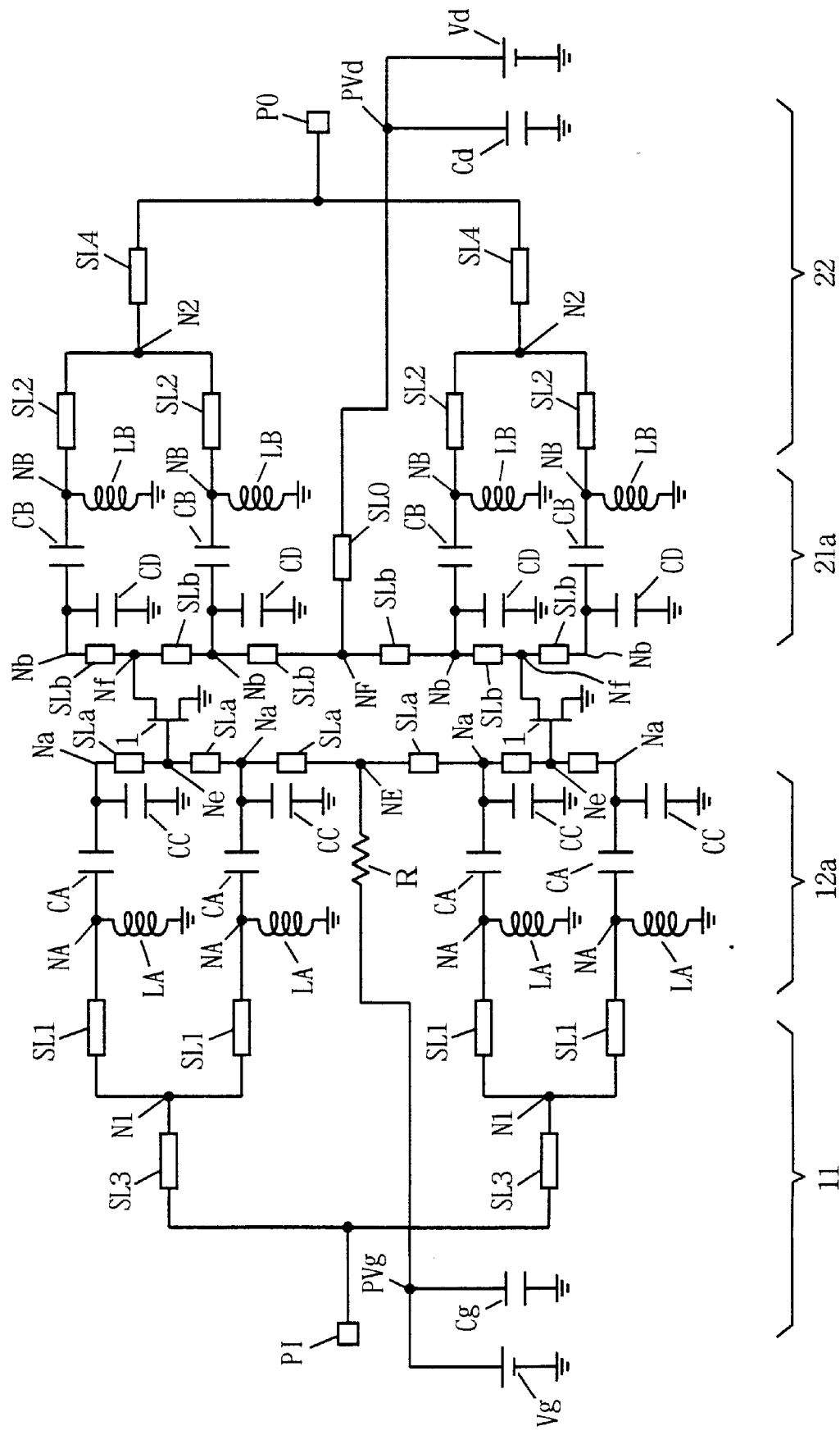
FIG. 18 is a circuit diagram showing the structure of a power amplifier in a fifth embodiment of the present invention.

FIG. 18 is a circuit diagram showing the structure of a power amplifier in a fifth embodiment of the present invention. The power amplifier shown in FIG. 18 differs from that in FIG. 14 in the following points.

Two first lines SLa are connected in series between the adjacent two nodes Na corresponding to different FETs 1. The node NE between the two first lines SLa is connected to the gate-bias pad PVg through the resistor R. The gate-bias power-supply Vg and the capacitor Cg for stabilizing the power-supply voltage are connected to the gate-bias pad PVg.

Two second lines SLb are connected in series between the adjacent two nodes Nb corresponding to different FETs 1. The node NF between the two second lines SLb is connected to the drain-bias pad PVd through the λ/4 line SL0. Connected to the drain-bias pad PVd are the drain-bias power-supply Vd, an end of the λ/4 line SL0, and the capacitor Cd for stabilization of the power-supply voltage.

In the power amplifier of this embodiment, since the path of supply of the gate bias to the gates of the two FETs 1 has symmetry, the two FETs 1 operate under an equal gate bias application condition. Further, since the path for supplying the drain bias to the drains of the two FETs 1 has symmetry, the two FETs 1 operate under an equal drain bias application condition. This improves the high-frequency characteristic of the power amplifier.

Figure 19:
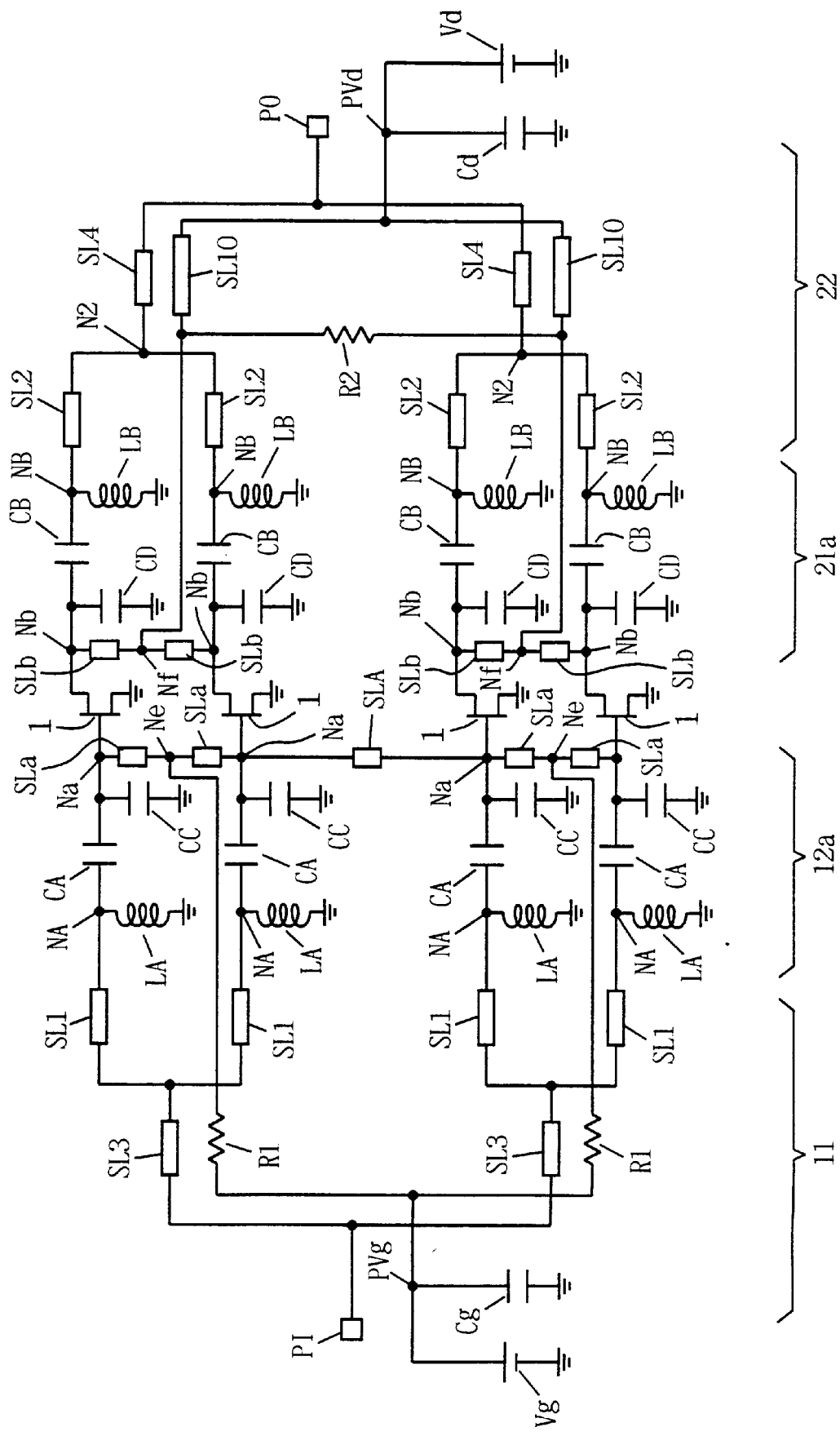
FIG. 19 is a circuit diagram showing the structure of a power amplifier in a sixth embodiment of the present invention.

FIG. 19 is a circuit diagram showing the structure of a power amplifier in a sixth embodiment of the present invention. The power amplifier shown in FIG. 19 differs from that shown in FIG. 14 in the following points.

The power amplifier shown FIG. 19 uses four FETs 1. Each two of the FETs 1 form a set. The four chips of the FETs 1 are not mounted on a chip carrier, but are individually accommodated in packages.

Each node Na is connected to the gate of a corresponding FET 1 through bonding wire. Two first lines SLa are connected in series between two of the nodes Na. The node Ne between the two first lines SLa is connected to the gate-bias pad PVg through the resistor R1. The gate-bias power-supply Vg and the capacitor Cg for stabilizing the power-supply voltage are connected to the gate-bias pad PVg. The first line SLA is connected between the inner two of the nodes Na.

Each node Nb is connected to the drain of a corresponding FET 1 through bonding wire. Two second lines SLb are connected in series between each two of the nodes Nb. The node Nf between the two second lines SLb is connected to the drain-bias pad PVd through the λ/4 line SL10. Connected to the drain-bias pad PVd are the drain-bias power-supply Vd, an end of the λ/4 line SL10, and the capacitor Cd for stabilization of the power-supply voltage. The resistor R2 is connected between the two nodes Nf.

In the power amplifier in this embodiment, since the path of supply of the gate bias to the gates of two FETs 1 in each set has symmetry and the path of supply of the gate bias to the gates of the two sets of the FETs 1 has symmetry, the four FETs 1 operate under the same gate bias application condition. Furthermore, since the path of supply of the drain bias to the drains of two FETs 1 in each set has symmetry and the path of supply of the drain bias to the two sets of the FETs 1 has symmetry, the four FETs 1 operate under the same drain bias application condition. This results in improvement of the high-frequency characteristic of the power amplifier.

Figure 20A:
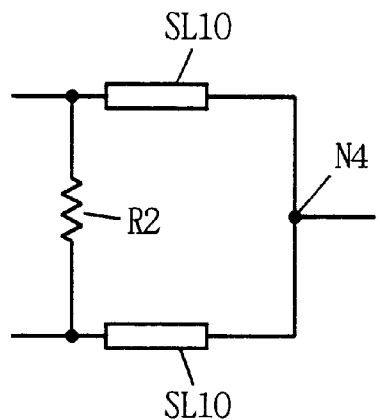
FIG. 20 provides circuit diagrams showing examples of symmetrical circuits.
Figure 20B:
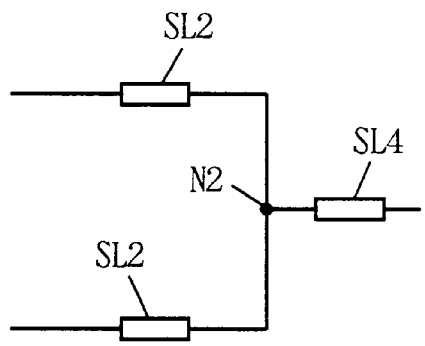

FIG. 20 provides examples of symmetrical circuits. The symmetrical circuit shown in FIG. 20(a) is used in the drain bias application circuit in the power amplifier in FIG. 19. The symmetrical circuit shown in FIG. 20(b) is used in the combiner 22 in the power amplifier in FIG. 19.

Figure 20C:
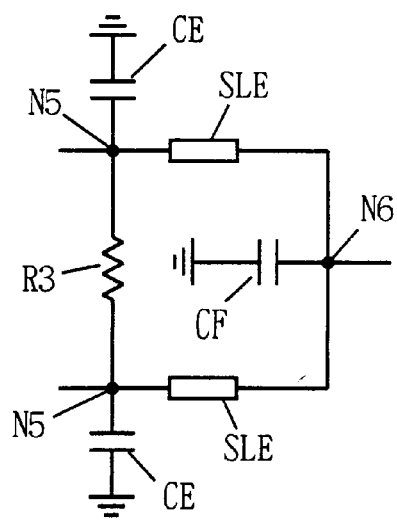

The symmetrical circuit shown in FIG. 20(c) is composed of one resistor R3, two capacitors CE, two lines SLE and one capacitor CF. Each capacitor CE is connected between a node N5 and the ground potential and each line SLE is connected between the node N5 and the node N6. The resistor R3 is connected between the nodes N5 and the capacitor CF is connected between the node N6 and the ground potential.

The symmetrical circuits shown in FIG. 20 can be used in various circuits, e.g., power-supply circuits, such as gate-bias application circuits and drain-bias application circuits, dividers, combiners, etc. This allows the power amplifiers to have symmetry.

The power amplifiers of the fifth and sixth embodiments have good high-frequency characteristic with the symmetries of the gate bias supply path and the drain bias supply path, which can be used in the high-frequency region of 12 GHz or higher. Accordingly, the power amplifiers of the fifth and sixth embodiments can be applied to MMICs (Monolithic Microwave Integrated Circuits) and MIC (Microwave Integrated Circuits).

The power amplifiers of the present invention can be applied to mobile communication base stations, broad-band CATV (Cable Television) systems for 0–800 MHz, radars for use in frequency bands such as the X band, Ku band, or C band, microwave communications, satellite communication systems, satellite broadcastings, etc.

The present invention can also be applied to power amplifiers formed of bipolar transistors.

While the invention has been described in detail, the foregoing description is in all aspects illustrative and not restrictive. It is understood that numerous other modifications and variations can be devised without departing from the scope of the invention.

We claim:

1. A power amplifier, comprising:
    a plurality of transistors each having an input electrode, an output electrode, and a ground electrode;
    a divider for distributing an input AC signal to the input electrodes of said plurality of transistors;
    a first matching circuit for obtaining an impedance match between each of said plurality of transistors and said divider;
    a combiner for combining AC signals outputted from the output electrodes of said plurality of transistors;
    a second matching circuit for obtaining an impedance match between each of said plurality of transistors and said combiner;
    a line provided separately from said combiner, for interconnecting the output electrodes of said plurality of transistors; and
    a DC bias input portion receiving a DC bias, for applying said DC bias to the output electrodes of said plurality of transistors through said line without going through said combiner and said second matching circuit.

2. The power amplifier according to claim 1, wherein said second matching circuit comprises a plurality of capacitors each connected between the output electrode of each of said plurality of transistors and said combiner, and a plurality of inductors each connected between a connection between said combiner and each of said plurality of capacitors and a ground potential.

3. The power amplifier according to claim 1, wherein said second matching circuit comprises a plurality of first capacitors each connected between the output electrode of each of said plurality of transistors and said combiner, a plurality of second capacitors each connected between one end of each of said plurality of first capacitors and a ground potential, and a plurality of inductors each connected between the other end of each of said plurality of first capacitors and the ground potential.

4. The power amplifier according to claim 1, wherein said DC bias input portion is connected to a middle point of said line between the output electrodes of each adjacent two of the transistors.

5. The power amplifier according to claim 1, wherein
    said input electrode is a gate electrode or a base electrode,
    said output electrode is a drain electrode or a collector electrode, and
    said ground electrode is a source electrode or an emitter electrode.

6. The power amplifier according to claim 1, wherein said plurality of transistors are mounted on a chip carrier.

7. The power amplifier according to claim 1, wherein said plurality of transistors are individually accommodated in packages.

8. A power amplifier, comprising:
    a plurality of transistors each having an input electrode, an output electrode, and a ground electrode;
    a divider for distributing an input AC signal to the input electrodes of said plurality of transistors;
    a first matching circuit for obtaining an impedance match between each of said plurality of transistors and said divider;
    a combiner for combining AC signals outputted from the output electrodes of said plurality of transistors;
    a second matching circuit for obtaining an impedance match between each of said plurality of transistors and said combiner;
    a line provided separately from said divider, for interconnecting the input electrodes of said plurality of transistors; and
    a DC bias input portion receiving a DC bias, for applying said DC bias to the input electrodes of said plurality of transistors through said line without going through said divider and said first matching circuit.

9. The power amplifier according to claim 8, wherein said first matching circuit comprises a plurality of capacitors each connected between said divider and the input electrode of each of said plurality of transistors, and a plurality of inductors each connected between a connection between said divider and each of said plurality of capacitors and a ground potential.

10. The power amplifier according to claim 8, wherein said first matching circuit comprises a plurality of first capacitors each connected between said divider and the input electrode of each of said plurality of transistors, a plurality of inductors each connected between one end of each of said plurality of first capacitors and a ground potential, and a plurality of second capacitors each connected between the other end of each of said plurality of first capacitors and the ground potential.

11. The power amplifier according to claim 8, wherein said DC bias input portion is connected to a middle point of said line between the input electrodes of each adjacent two of the transistors.

12. The power amplifier according to claim 8, wherein
said input electrode is a gate electrode or a base electrode,
said output electrode is a drain electrode or a collector electrode, and
said ground electrode is a source electrode or an emitter electrode.

13. The power amplifier according to claim 8, wherein said plurality of transistors are mounted on a chip carrier.

14. The power amplifier according to claim 8, wherein said plurality of transistors are individually accommodated in packages.

15. A power amplifier, comprising:
a plurality of transistors each having an input electrode, an output electrode, and a ground electrode;
a divider for distributing an input AC signal to the input electrodes of said plurality of transistors;
a first matching circuit for obtaining an impedance match between each of said plurality of transistors and said divider;
a combiner for combining AC signals outputted from the output electrodes of said plurality of transistors;
a second matching circuit for obtaining an impedance match between each of said plurality of transistors and said combiner;
a first line provided separately from said divider, for interconnecting the input electrodes of said plurality of transistors;
a second line provided separately from said combiner, for interconnecting the output electrodes of said plurality of transistors;
a first DC bias input portion receiving a first DC bias, for applying said first DC bias to the input electrodes of said plurality of transistors through said first line without through said divider and said first matching circuit; and
a second DC bias input portion receiving a second DC bias, for applying said second DC bias to the output electrodes of said plurality of transistors through said second line without going through said combiner and said second matching circuit.

16. The power amplifier according to claim 15, wherein said second matching circuit comprises a plurality of capacitors each connected between the output electrode of each of said plurality of transistors and said combiner, and a plurality of inductors each connected between a connection between said combiner and each of said plurality of capacitors and a ground potential.

17. The power amplifier according to claim 15, wherein said second matching circuit comprises a plurality of first capacitors each connected between the output electrode of each of said plurality of transistors and said combiner, a plurality of second capacitors each connected between one end of each of said plurality of first capacitors and a ground potential, and a plurality of inductors each connected between the other end of each of said plurality of first capacitors and the ground potential.

18. The power amplifier according to claim 15, wherein said first matching circuit comprises a plurality of capacitors each connected between said divider and the input electrode of each of said plurality of transistors, and a plurality of inductors each connected between a connection between said divider and each of said plurality of capacitors and a ground potential.

19. The power amplifier according to claim 15, wherein said first matching circuit comprises a plurality of first capacitors each connected between said divider and the input electrode of each of said plurality of transistors, a plurality of inductors each connected between one end of each of said plurality of first capacitors and a ground potential, and a plurality of second capacitors each connected between the other end of each of said plurality of first capacitors and the ground potential.

20. The power amplifier according to claim 15,
wherein said first DC bias input portion is connected to a middle point of said first line between the input electrodes of each adjacent two of the transistors, and
said second DC bias input portion is connected to a middle point of said second line between the output electrodes of each adjacent two of the transistors.

21. The power amplifier according to claim 15, wherein
said divider has 2n output nodes,
said combiner has 2n input nodes,
said first matching circuit includes 2n first matching elements each connected to each of the 2n output nodes of said divider,
said second matching circuit includes 2n second matching elements each connected to each of the 2n input nodes of said combiner,
said first line interconnects output-side nodes of said 2n first matching elements, and
said second line interconnects input-side nodes of said 2n second matching elements.

22. The power amplifier according to claim 21, wherein
said plurality of transistors includes 2n transistors corresponding to said 2n first matching elements and said 2n second matching elements,
said input electrode of each said transistor being connected to the output-side node of a corresponding one of said first matching elements,
said output electrode of each said transistor being connected to the input-side node of a corresponding one of said second matching elements.

23. The power amplifier according to claim 21,
wherein said plurality of transistors include n transistors,
said input electrode of each said transistor corresponds to each two of said first matching elements, and is connected to a middle point of said first line between the output-side nodes of the corresponding two of said first matching elements, and
said output electrode of each said transistor corresponds to each two of said second matching elements, and is connected to a middle point of said second line between the input-side nodes of the corresponding two of said second matching elements.

24. The power amplifier according to claim 21,
wherein each said first matching element comprises a capacitor connected between a corresponding one of the output nodes of said divider and said output-side node, and an inductor connected between a corresponding one of the output nodes of said divider and a ground potential, and
each said second matching element comprises a capacitor connected between said input-side node and a corresponding one of the input nodes of said combiner and an inductor connected between a corresponding one of the input nodes of said combiner and the ground potential.

25. The power amplifier according to claim 24,
wherein each said first matching element further comprises a capacitor connected between said output-side node and the ground potential, and each said second matching element further comprises a capacitor connected between said input-side node and the ground potential.

26. The power amplifier according to claim 15,
wherein said input electrode is a gate electrode or a base electrode,
said output electrode is a drain electrode or a collector electrode, and
said ground electrode is a source electrode or an emitter electrode.

27. The power amplifier according to claim 15,
wherein said plurality of transistors are mounted on a chip carrier,
said chip carrier comprising, a substrate,
a first line which is formed on said substrate and to which the input electrodes of said plurality of transistors rare connected in common,
a second line which is formed on said substrate and to which the output electrodes of said plurality of transistors are connected in common, and
a ground conductor which is formed on said substrate and to which the ground electrodes of said plurality of transistors are connected in common.

28. The power amplifier according to claim 15, wherein said plurality of transistors are individually accommodated in packages.

* * * * *